(12) United States Patent
Li et al.

(10) Patent No.: US 12,527,039 B2
(45) Date of Patent: Jan. 13, 2026

(54) SEMICONDUCTOR DEVICES WITH ENHANCED CARRIER MOBILITY

(71) Applicant: Taiwan Semiconductor Manufacturing Company, Ltd., Hsinchu (TW)

(72) Inventors: Ming-Shuan Li, Hsinchu County (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 620 days.

(21) Appl. No.: 17/465,514

(22) Filed: Sep. 2, 2021

(65) Prior Publication Data
US 2022/0310840 A1 Sep. 29, 2022

Related U.S. Application Data

(60) Provisional application No. 63/166,412, filed on Mar. 26, 2021.

(51) Int. Cl.
H10D 30/69 (2025.01)
H01L 21/02 (2006.01)
(Continued)

(52) U.S. Cl.
CPC ....... *H10D 30/796* (2025.01); *H01L 21/0259* (2013.01); *H01L 21/26526* (2013.01);
(Continued)

(58) Field of Classification Search
CPC ............. H01L 29/7847; H01L 21/0259; H01L 21/26526; H01L 29/0665; H01L 29/42392;
(Continued)

(56) References Cited

U.S. PATENT DOCUMENTS 6,225,197 B1 * 5/2001 Maekawa ......... H01L 29/66757
257/E29.147
9,293,534 B2  3/2016 Tsai et al.
(Continued)

OTHER PUBLICATIONS

Chien-Hao Chen et al., "Stress memorization technique (SMT) by selectively strained-nitride capping for sub-65nm high-performance strained-Si device application," Digest of Technical Papers. 2004 Symposium on VLSI Technology, 2004., Honolulu, HI, USA, 2004, pp. 56-57, doi: 10.1109/VLSIT.2004.1345390.

*Primary Examiner* — Duy T Nguyen
*Assistant Examiner* — Zhijun Xu
(74) *Attorney, Agent, or Firm* — HAYNES AND BOONE, LLP

(57) ABSTRACT

A semiconductor structure and a method of forming the same are provided. In an embodiment, an exemplary semiconductor method includes forming a fin-shaped structure extending from a substrate, the fin-shaped structure includes a number of channel layers interleaved by a number of sacrificial layers, recessing a source/drain region to form a source/drain opening, performing a PAI process to amorphize a portion of the substrate exposed by the source/drain opening, forming a tensile stress film over the substrate, performing an annealing process to recrystallize the portion of the substrate, the recrystallized portion of the substrate includes dislocations, forming an epitaxial source/drain feature over the source/drain opening, and forming a gate structure wrapping around each of the plurality of channel layers. By performing the above operations, dislocations are controllably and intentionally formed and carrier mobility in the number of channel layers may be advantageously enhanced, leading to improved device performance.

20 Claims, 32 Drawing Sheets

(51) Int. Cl.
*H01L 21/265* (2006.01)
*H10D 30/01* (2025.01)
*H10D 30/67* (2025.01)
*H10D 62/10* (2025.01)
*H10D 64/01* (2025.01)

(52) U.S. Cl.
CPC ....... *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 64/018* (2025.01)

(58) Field of Classification Search
CPC ......... H01L 29/66545; H01L 29/66553; H01L 29/66742; H01L 29/78618; H01L 29/78696; H01L 29/0673; H01L 29/0847; H01L 29/66439; H01L 21/02433; H01L 21/02529; H01L 21/02576; H01L 21/0245; H01L 21/02532; H01L 21/02667; H01L 29/32; H01L 29/165; H01L 29/7848; H01L 29/775; B82Y 10/00

See application file for complete search history.

(56) References Cited

U.S. PATENT DOCUMENTS

| | | | |
|---|---|---|---|
| 9,502,559 | B2 | 11/2016 | Yu et al. |
| 9,595,522 | B2 | 3/2017 | Tsai et al. |
| 2014/0346576 | A1* | 11/2014 | Lu .......... H01L 29/785 438/297 |
| 2015/0028355 | A1* | 1/2015 | Fang .......... H01L 21/823807 257/77 |
| 2015/0270342 | A1* | 9/2015 | Tsai .......... H01L 29/045 438/283 |
| 2016/0035892 | A1* | 2/2016 | Yu .......... H01L 29/167 438/300 |
| 2020/0266060 | A1* | 8/2020 | Cheng .......... H01L 29/0673 |
| 2020/0350404 | A1 | 11/2020 | Tsai et al. |
| 2021/0217860 | A1* | 7/2021 | Ha .......... H01L 29/66545 |

* cited by examiner

SEMICONDUCTOR DEVICES WITH ENHANCED CARRIER MOBILITY

PRIORITY

This application claims the priority to U.S. Provisional Application Ser. No. 63/166,412, filed Mar. 26, 2021, entitled "Semiconductor Devices with Enhanced Carrier Mobility," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control and have been observed to increase gate-channel coupling, reduce OFF-state current, and/or reduce short-channel effects (SCEs). One such multi-gate device is the multi-bridge-channel (MBC) transistors. The channel region of an MBC transistor may include nanowires, nanosheets, or other nanostructures and for that reasons, an MBC transistor may also be referred to as a nanowire transistor or a nanosheet transistor. MBC devices enable aggressive scaling down of IC technologies, maintaining gate control and mitigating SCEs, while seamlessly integrating with conventional IC manufacturing processes. However, as MBC devices continue to scale, challenges arise in achieving a desired performance (e.g., a higher drive capacity and/or a higher switching speed). Accordingly, although existing semiconductor devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
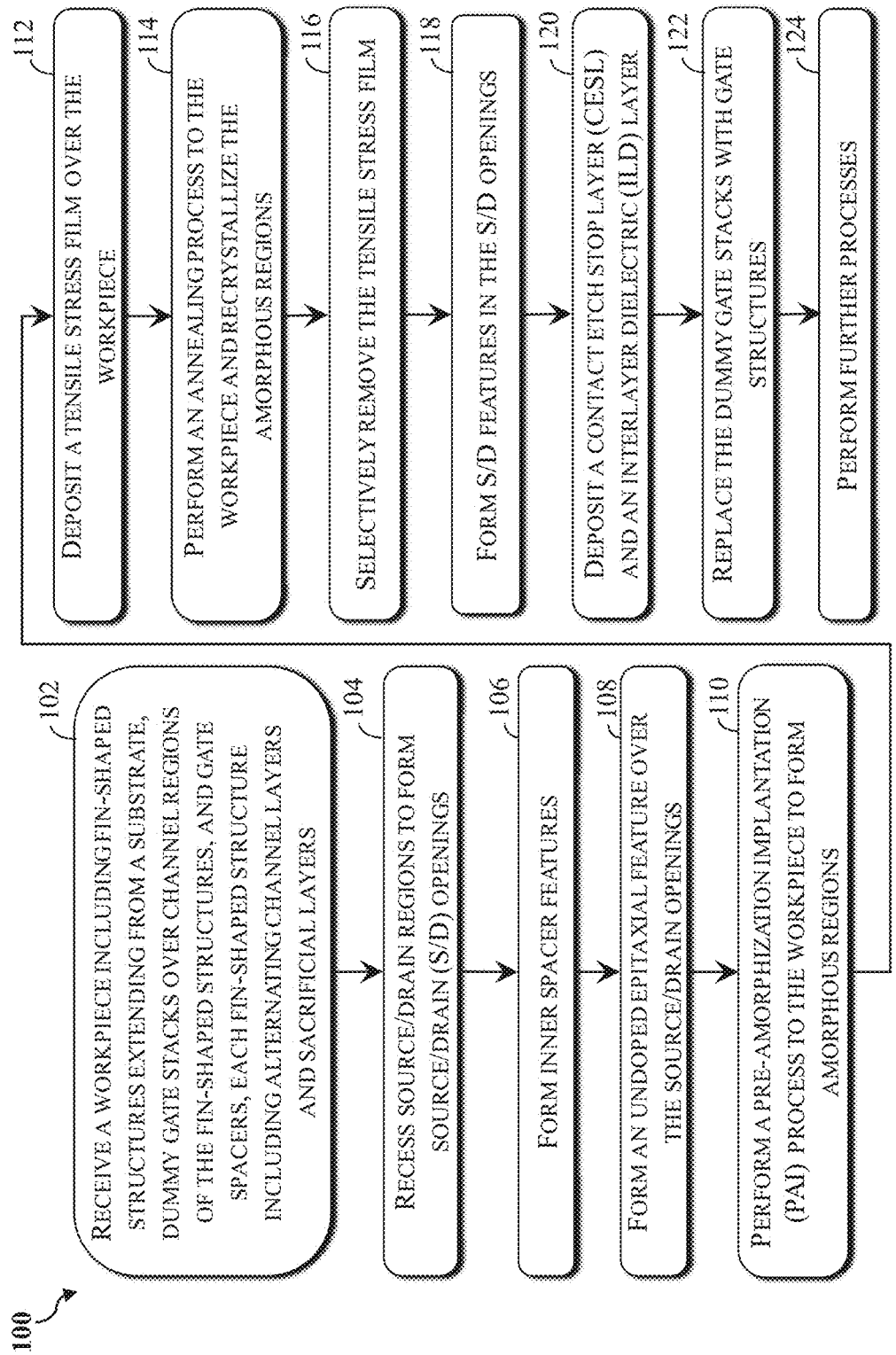
FIG. 1 illustrates a flow chart of an exemplary method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Semiconductor devices for different applications may have different requirements with regards to switching speed. For example, in applications such as high-speed wireless/wire-line communication, semiconductor devices having a higher switching speed may be desired. Strained source/drain features may be implemented in P-type transistors to enhance carrier (e.g., hole) mobility and improve device performance. However, forming strained source/drain features in N-type transistors to improve carrier (e.g., electron)

mobility may be challenging. The present disclosure is mainly focused on enhancing electron mobility in channel regions of N-type MBC transistors. While performing operations to the N-type device regions to form N-type MBC transistors, photolithography process may be used to cover other regions, such as P-type device regions used for forming P-type transistors, on substrate. A resist removal process may be used before the next operation. Additional cleaning process may be used to ensure no residual resist remains on the substrate.

The present disclosure provides semiconductor devices with enhanced carrier mobility and methods of fabricating the semiconductor devices. In an exemplary embodiment, a method includes forming a fin-shaped structure extending from a substrate, the fin-shaped structure includes a number of channel layers interleaved by a number of sacrificial layers. The method also includes recessing a source/drain region of the fin-shaped structure to form a source/drain opening, performing a pre-amorphization implantation (PAI) process to amorphize a portion of the substrate exposed by the source/drain opening, forming a tensile stress film over the substrate, performing an annealing process to recrystallize the amorphized portion of the substrate and forming an epitaxial source/drain feature over the source/drain opening. After the annealing process, dislocations are formed in the workpiece, and carrier mobility in each channel layer may be enhanced, thereby providing improved device performance (e.g., a higher drive capacity and/or a higher switching speed).

The various aspects of the present disclosure will now be described in more detail with reference to the figures. In that regard, FIG. 1 is a flow chart illustrating method 100 of forming a semiconductor device. FIG. 16 is a flow chart illustrating method 300 of forming a semiconductor device. Method 100 and method 300 are described below in conjunction with FIGS. 2-15 and 17-32. Method 100 and 300 are merely examples and are not intended to limit the present disclosure to what is explicitly illustrated therein. Additional steps may be provided before, during, and/or after the method 100 and method 300, and some steps described can be replaced, eliminated, or moved around for additional embodiments of the method. Not all steps are described herein in detail for reasons of simplicity. Because the workpieces 200 and 400 will be fabricated into semiconductor device 200 and 400 upon conclusion of the fabrication processes, the workpiece 200 or 400 may be referred to as the semiconductor device 200 or 400 as the context requires. For avoidance of doubts, the X, Y and Z directions in FIGS. 2-15 and 17-32 are perpendicular to one another and are used consistently throughout FIGS. 2-15 and 17-32. Throughout the present disclosure, like reference numerals denote like features unless otherwise excepted.

Figure 2:
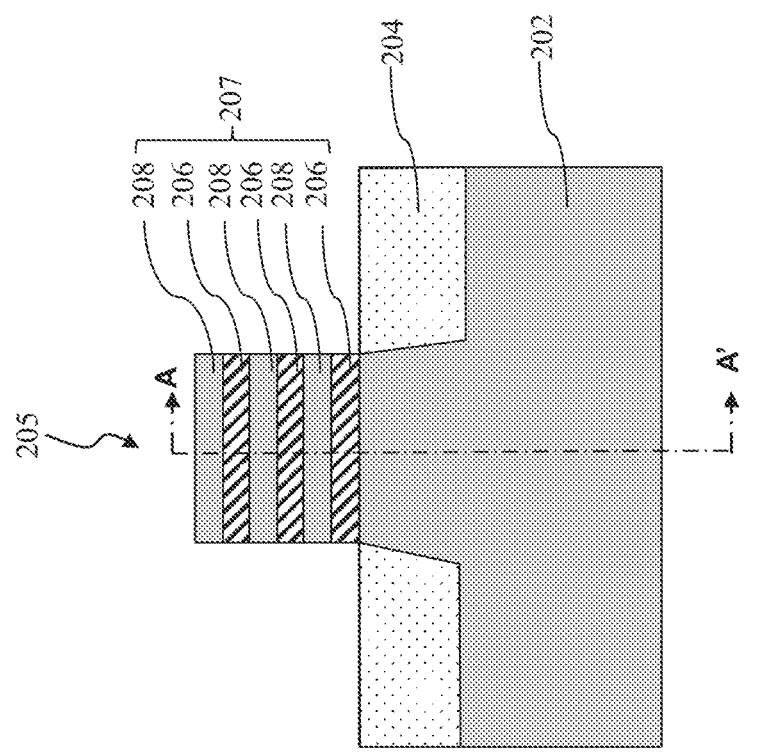
FIGS. 2-15 illustrate fragmentary cross-sectional views of an exemplary workpiece during various fabrication stages in the method of FIG. 1, according to one or more aspects of the present disclosure.
Figure 3:
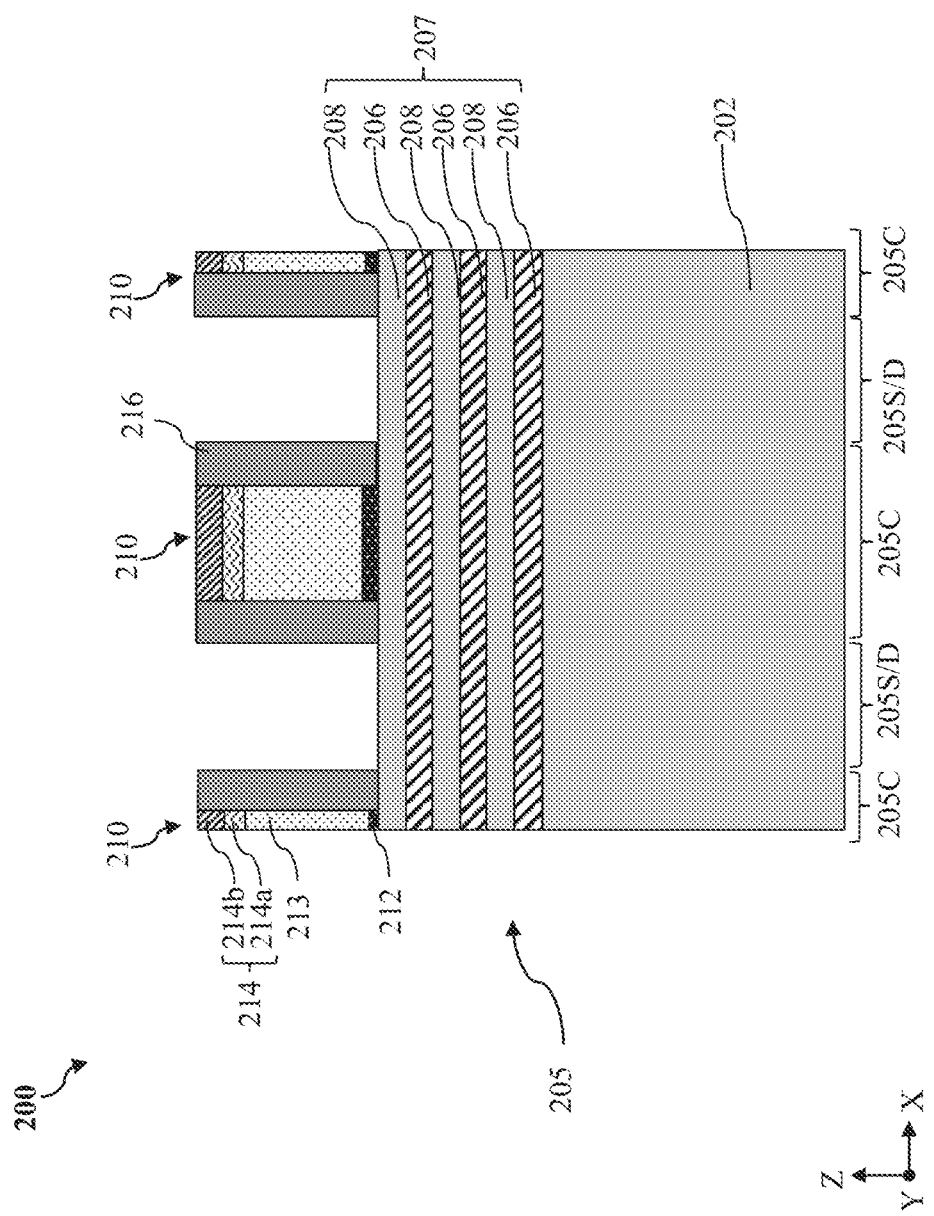

Referring to FIGS. 1-3, method 100 includes a block 102 where a workpiece 200 is received. As shown in FIG. 2, the workpiece 200 includes a substrate 202. In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods.

As shown in FIG. 2, the workpiece 200 also includes a fin-shaped structure 205 disposed over the substrate 202. The fin-shaped structure 205 may be formed from a portion of the substrate 202 and a vertical stack 207 of alternating semiconductor layers 206 and 208. In the depicted embodiment, the vertical stack 207 may include a number of channel layers 208 interleaved by a number of sacrificial layers 206. Each of the channel layers 208 may be formed of silicon and each of the sacrificial layers 206 may be formed of silicon germanium. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In this depicted example, the vertical stack 207 includes three sacrificial layers 206 and three channel layers 208. Other number of layers are possible. For example, each of the sacrificial layers 206 and the number of the channel layers 208 may include 4 to 10 layers.

The workpiece 200 also includes an isolation structure 204 formed around the bottom portion of the fin-shaped structure 205 to isolate the fin-shaped structure 205 from an adjacent fin-shaped structure. In some embodiments, the isolation structure 204 is deposited in trenches that define the fin-shaped structure 205. Such trenches may extend through the channel layers 208 and sacrificial layers 206 and terminate in the substrate 202. The isolation structure 204 may also be referred to as a shallow trench isolation (STI) feature. The isolation structure 204 may include silicon oxide, silicon oxynitride, fluorine-doped silicate glass (FSG), a low-k dielectric, combinations thereof, and/or other suitable materials.

In embodiments represented in FIG. 3, a cross-sectional view of the workpiece 200 taken along line A-A' shown in FIG. 2 is shown. The fin-shaped structure 205 extends lengthwise along the X direction and is divided into channel regions 205C, source regions 205S/D, and drain regions 205S/D. Each of the channel regions 205C is disposed between a source region 205S/D and a drain region 205S/D along the X direction. Dummy gate stacks 210 are then formed over the channel regions 205C. In this embodiment, a gate replacement process (or gate-last process) is adopted where the dummy gate stacks 210 serve as placeholders for functional gate structures. Other processes for forming functional gate structures are possible. Suitable deposition process, photolithography and etching process may be employed to form the dummy gate stack 210. As shown in FIG. 3, the dummy gate stack 210 includes a dummy dielectric layer 212, a dummy gate electrode layer 213 over the dummy dielectric layer 212, and a gate-top hard mask layer 214 over the dummy gate electrode layer 213. In an embodiment, the dummy dielectric layer 212 includes silicon oxide. The dummy gate electrode layer 213 includes polysilicon. The gate-top hard mask layer 214 may be a multi-layer and may include a silicon oxide layer 214a and a silicon nitride layer 214b disposed on the silicon oxide layer 214a. A gate spacer 216 is formed along the sidewalls of the dummy gate stack 210. In some embodiments, the gate spacer 216 may include silicon oxycarbide, silicon carbonitride, silicon nitride, zirconium oxide, aluminum oxide, or a suitable dielectric material.

Figure 4:
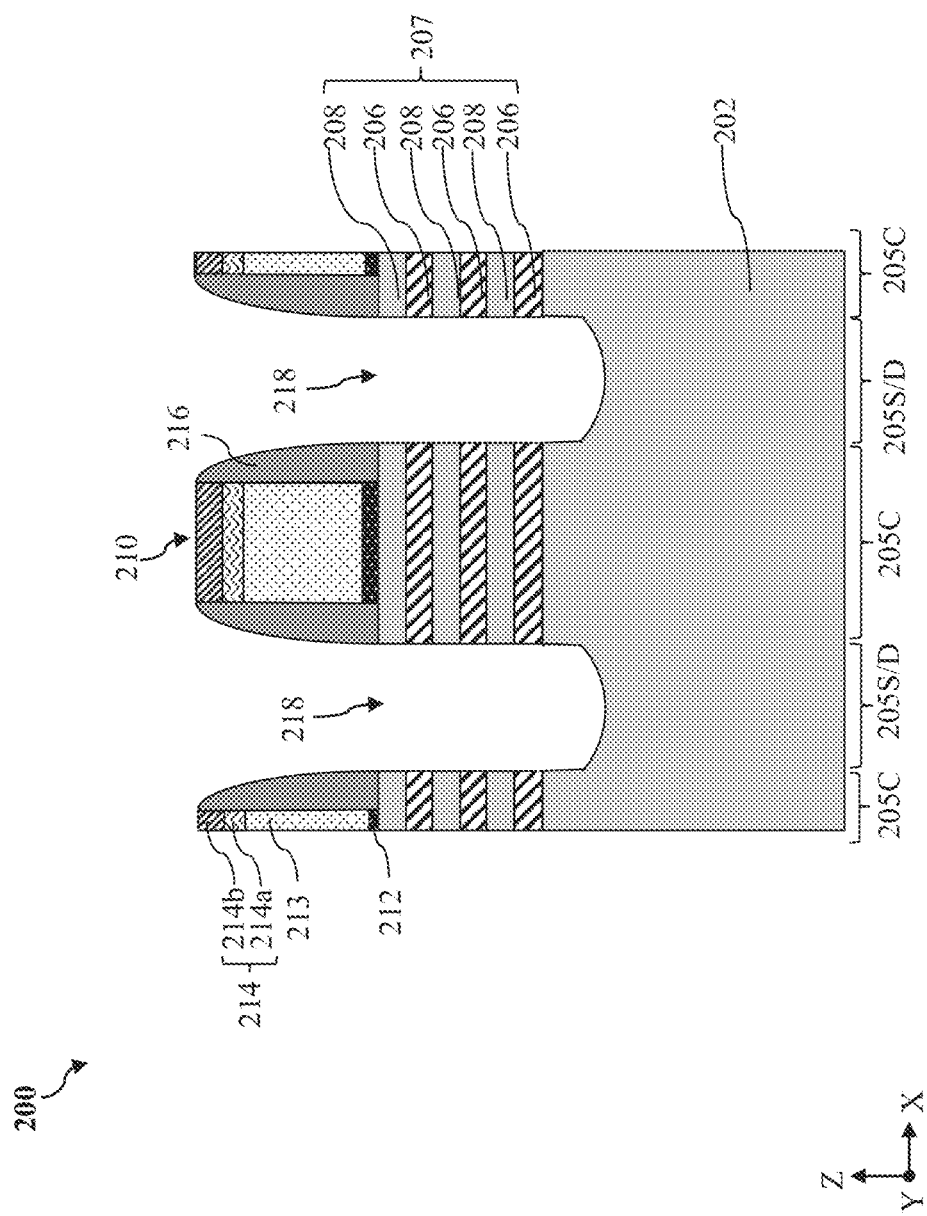

Referring to FIGS. 1 and 4, method 100 includes a block 104 where a first source/drain region 205S/D and a second source/drain region 205S/D are recessed to form source/drain openings 218. The first and second source/drain source regions 205S/D of the fin-shaped structures 205 that are not covered by the dummy gate stack 210 and the gate spacer 216 are anisotropically etched by a dry etching process or a suitable etching process. The dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 4, the source/drain openings 218 extend through the vertical stack 207 and partially extend into the substrate 202. During the formation of the source/drain openings 218, the gate spacers 216 may be slightly etched.

Figure 5:
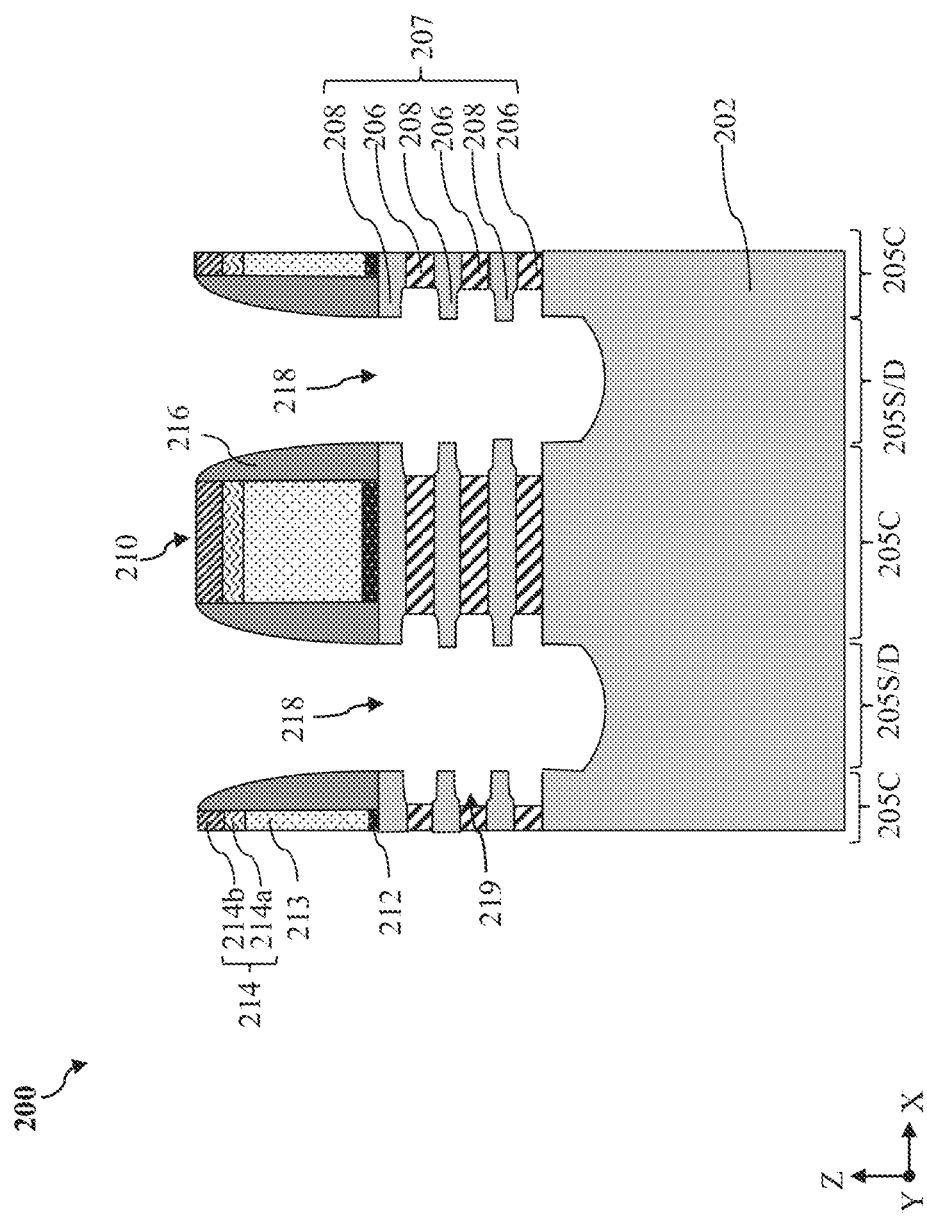
Figure 6:
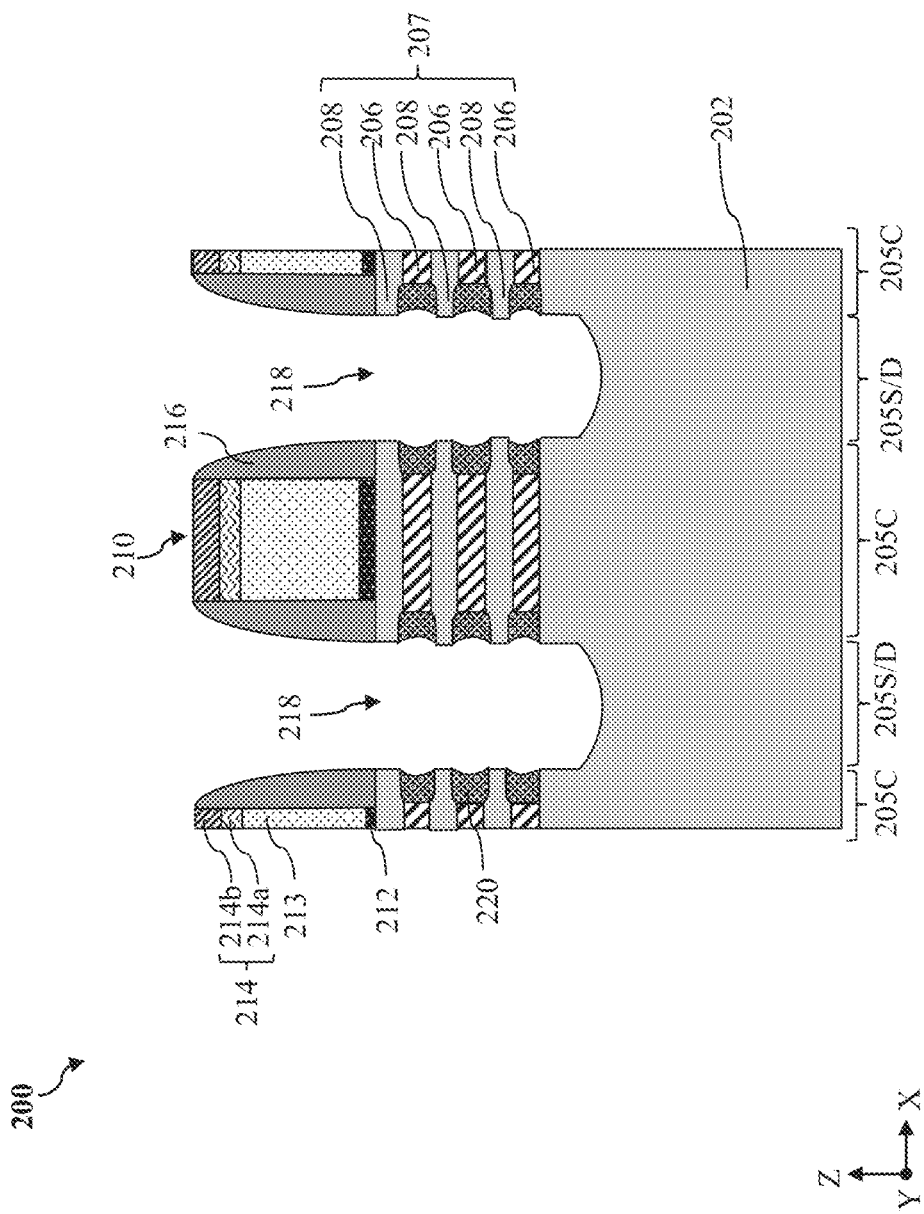

Referring to FIGS. 1 and 5-6, method 100 includes a block 106 where inner spacer features 220 are formed. After the sacrificial layers 206 are exposed in the source/drain openings 218, the sacrificial layers 206 may be selectively and partially recessed to form inner spacer recesses 219 while the exposed channel layers 208 are not significantly etched. In an embodiment where the channel layers 208 consist essentially of silicon and sacrificial layers 206 consist essentially of silicon germanium, the selective and partial recess of the sacrificial layers 206 may include use of a selective isotropic etching process. As shown in FIG. 6, after the formation of the inner spacer recesses 219, an inner spacer material layer is conformally deposited over the workpiece 200 to fill the inner spacer recesses 219. The conformal inner spacer material layer may have a thickness between about 5 nm and about 10 nm. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excessive inner spacer material layer over sidewalls of the channel layers 208, thereby forming the inner spacer features 220. In some embodiments, the etch back process at block 106 may be a dry etching process and in a way similar to the dry etching process used in the formation of the source/drain openings 218.

Figure 7:
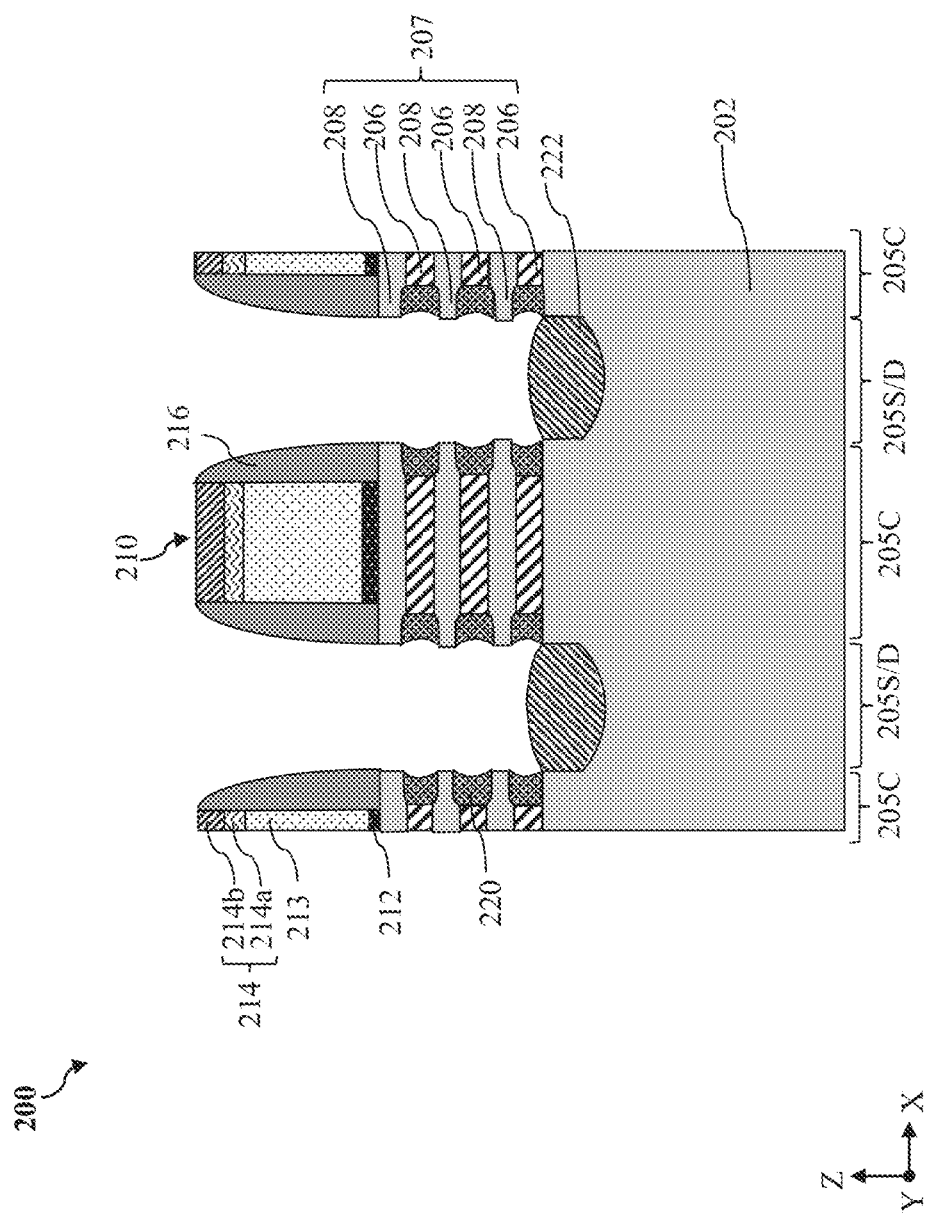

Referring to FIGS. 1 and 7, method 100 includes a block 108 where an undoped epitaxial layer 222 is formed over the source/drain opening 218. The undoped epitaxial layer 222 is configured to reduce or even prevent leakage current between the to-be-formed source/drain features 240 and the well regions (not explicitly shown) in the substrate 202. Forming the undoped epitaxial layer 222 would also facilitate the formation of a satisfactory amorphous region 226 (shown in FIG. 8). For example, without forming the undoped epitaxial layer 222, the following PAI process 224 would amorphize the substrate 202 at a deeper location, leading to a deeper dislocation core, and thus an increased distance to the channel layers and a less carrier mobility improvement. In some instances, the undoped epitaxial layer 222 has a thickness (along the Z direction) between about 5 nm and about 30 nm to facilitate the formation of satisfactory dislocations and achieve satisfactory carrier mobility. In an embodiment, the to-be-formed source/drain features 240 are N-type source/drain features, and the undoped epitaxial layer 222 may include silicon. In some embodiments, the undoped epitaxial layer 222 may include a silicon-carbon-containing (Si:C) epitaxial layer, a silicon-phosphorous-containing (Si:P) epitaxial layer, a silicon-carbon-phosphorous-containing epitaxial layer (Si:C:P), or a combination thereof, or other suitable materials. A concentration of the carbon, a concentration of the phosphorous, or a total concentration of the carbon and phosphorous in the undoped epitaxial layer 222 is less than 1%. The undoped epitaxial layer 222 is selectively and epitaxially deposited on the base portion of the source/drain openings 218. The undoped epitaxial layer 222 may be deposited using an epitaxial process, such as vapor-phase epitaxy (VPE), ultra-high vacuum CVD (UHV-CVD), molecular beam epitaxy (MBE), and/or other suitable processes. A top surface of the undoped epitaxial layer 222 may be a concave surface and is higher than a bottom surface of a bottommost inner spacer feature 220.

Figure 8:
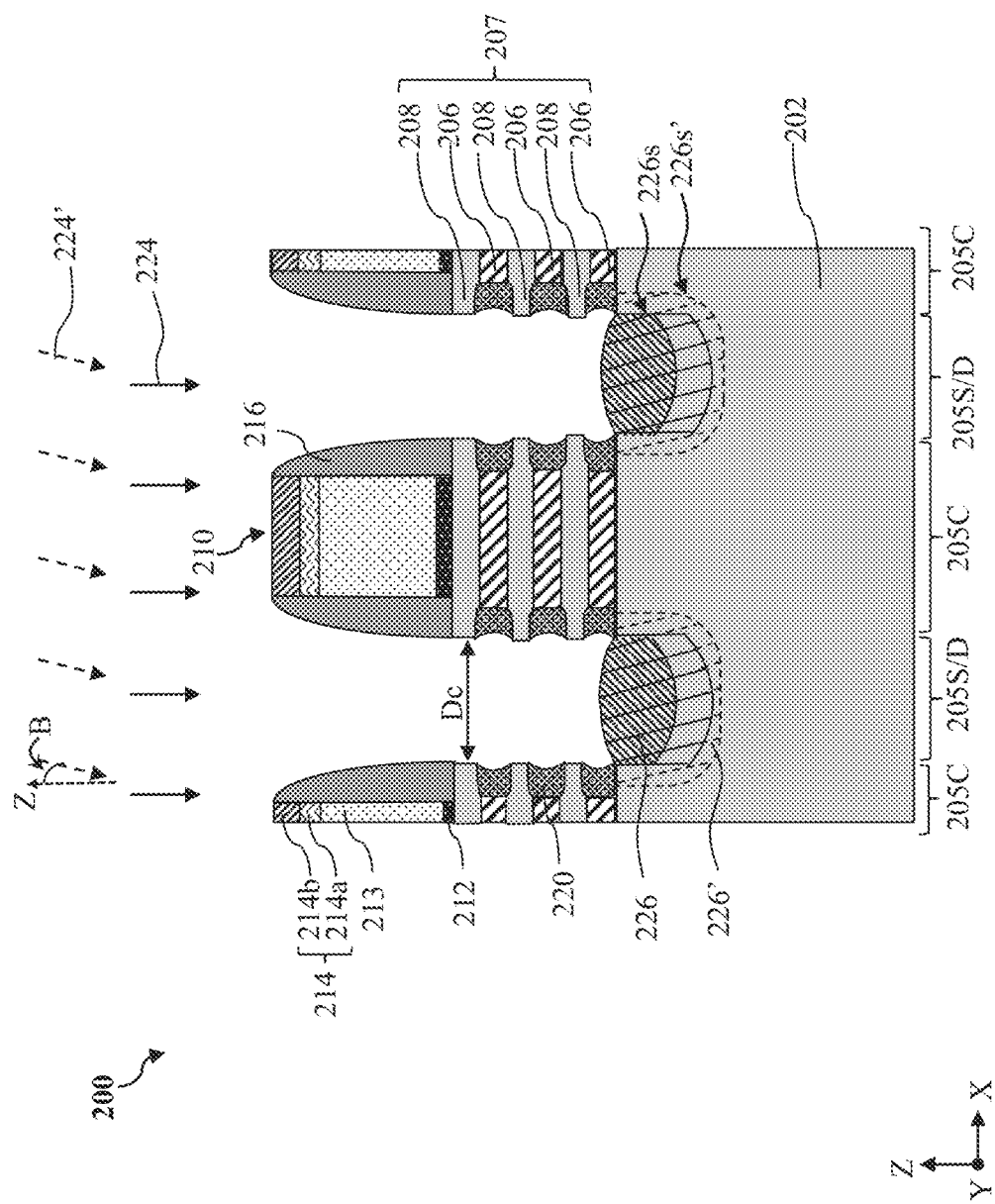

Referring to FIGS. 1 and 8, method 100 includes a block 110 where a pre-amorphization implantation (PAI) process 224 is performed to the workpiece 200 to form an amorphous region 226. The PAI process 224 implants the undoped epitaxial layer 222 and a portion of the substrate under the undoped epitaxial layer 222 with an implant species, randomizing the lattice structure and forming the amorphous region 226. In the PAI process 224, the implant species may include Si, C, Ge, Xe, Ar, or other suitable species. In the depicted embodiment, due to the formation of the undoped epitaxial layer 222, the PAI process 224 implants Ge at an implant energy from about 15 KeV to about 40 KeV, a dosage in a range from about 1 E14 atoms/$cm^2$ to about 5 E15 atoms/$cm^2$, a temperature in a range from about $-100°$ C. to about $-60°$ C., and an implant angle (an angle between the implant ion beam and the Z axis) substantially equal to $0°$ to form the amorphous region 226. That is, the implant ion beam is substantially perpendicular to the substrate 202. Accordingly, a shape of the cross-sectional view of the amorphous region 226 includes two substantially vertical sidewalls 226s, a convex top surface and a concave bottom surface. The sidewall 226s is substantially align with a sidewall of the inner spacer feature 220 that is not in contact with the sacrificial layer 206.

In some implementations, a second PAI process 224' may be followed to implant the same species or a different species than the PAI process 224 to form an enlarged and satisfactory amorphous region 226'. For example, the second PAI process 224' implants Xe at an implant energy from about 25 KeV to about 50 KeV, a dosage in a range from about 5 E13 atoms/$cm^2$ to about 1 E15 atoms/$cm^2$, and an implant angle B between about $0°$ and about $10°$. The implant angle B refers to a relative angle between the implant beam and the Z axis. The second PAI process 224' may be performed at room temperature (e.g., about $25°$ C.). The implant energy in the second PAI process 224' may be greater than that of the PAI process 224. The implementation of the second PAI process 224' contributes to the formation of an enlarged amorphous region 226' (shown in dashed lines) compared to amorphous region 226 that is formed only by the PAI process 224. This enlarged amorphous region 226' would further facilitate the improvement of the carrier mobility. For example, due to the implant angle B of the second PAI process 224', a sidewall 226s' of the enlarged amorphous region 226' does not align with the sidewall of the inner spacer feature 220. More specifically, at least a portion of the bottommost inner spacer feature 220 is disposed directly over and in direct contact with a portion of the enlarged amorphous region 226'. That is, a portion of the substrate disposed between the two enlarged amorphous regions 226' is smaller than that of the substrate disposed between the two amorphous regions 226, leading to an increased stress to be suffered by this portion of the substrate 202, and thus a greater carrier mobility.

Considering the shrunk dimensions of IC devices, misalignment during mask aligning in a lithography process, and the fabrication cost, no masking layer is formed on the dummy gate stacks 210 and gate spacer 216 during the PAI processes 224/224'. Thus, at least a portion of the gate spacer 216 would include implant species used in the PAI processes 224/224'. After the PAI process 224', the inner spacer features 220 may also include the implant species (e.g., Si, C, Ge, Xe, Ar) used in the second PAI process 224'.

Figure 9:
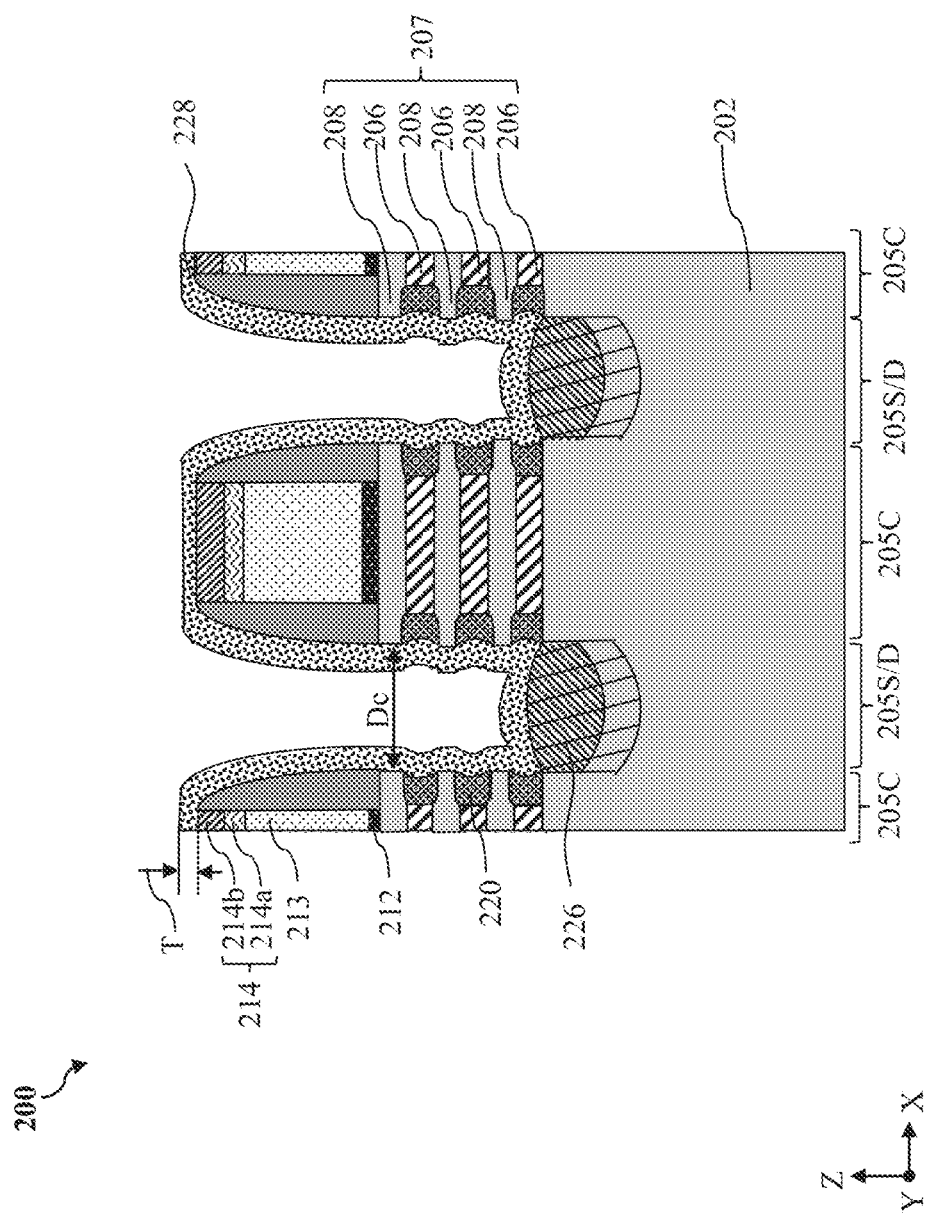

Referring to FIGS. 1 and 9, method 100 includes a block 112 where a tensile stress film 228 is formed over the workpiece 200. In an embodiment, the tensile stress film 228 is conformally deposited to have a generally uniform thickness T over the top surface of the workpiece 200 (e.g., having substantially the same thickness over the top surface of the amorphous region 226, sidewall surface of the gate spacer 216, and the top and sidewall surfaces of the dummy gate stacks 210) and partially fills the source/drain openings 218. The tensile stress film 228 may be formed by chemical vapor deposition (CVD), physical vapor deposition (PVD), atomic layer deposition (ALD), high density plasma CVD (HDPCVD), plating, other suitable methods, and/or combinations thereof. In this depicted example, considering the shrunk space between the two adjacent channel regions 205C, the tensile stress film 228 is formed by ALD. The distance between two adjacent channel regions 205C may be marked as Dc (shown in FIG. 8), and the thickness T of the tensile stress film 228 would be thick enough but is less than a half of Dc (i.e., T<½ Dc) such that the source/drain openings 218 between the two adjacent channel regions 205C would not be fully filled by the tensile stress film 228 to facilitate the removal of the tensile stress film 228 in a subsequent process. The tensile stress film 228 exerts tensile stress, which affects the recrystallization process. The thicker the tensile stress film 228, the greater the tensile stress. For example, a ratio of the thickness T to Dc (i.e., T/Dc) is between about ⅓ and about 3/7 to provide a satisfactory tensile stress without significantly affecting the removal of the tensile stress film 228. The tensile stress film 228 may include a nitrogen-containing dielectric material, such as silicon nitride, silicon carbonitride (SiCN), silicon oxynitride (SiON), or silicon oxycarbonitride (SiOCN), or other suitable materials, and/or combinations thereof.

Figure 10:
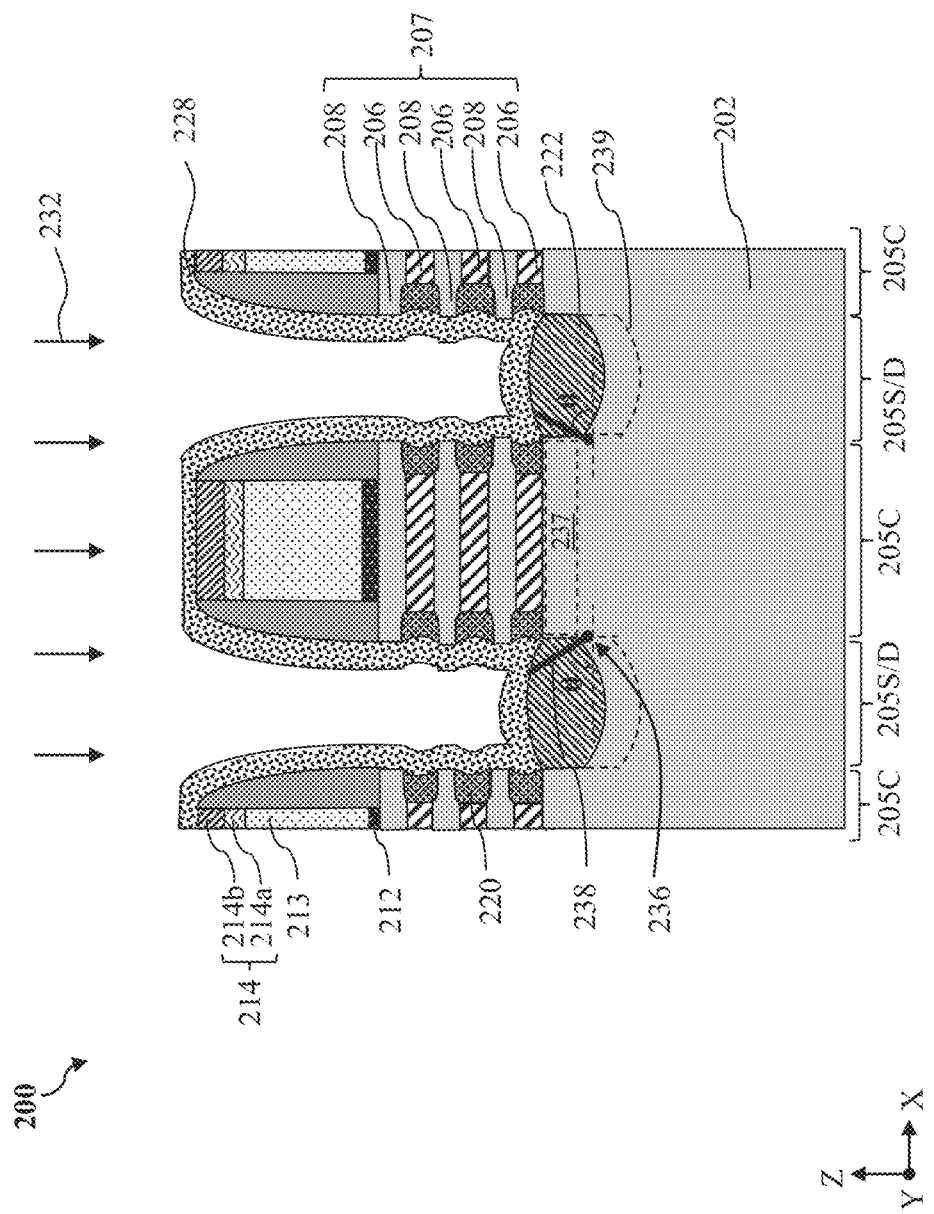

Referring to FIGS. 1 and 10, method 100 includes a block 114 where an annealing process 232 is performed to recrystallize the amorphous region 226. The annealing process 232 would convert (crystallize) the amorphous region 226 into crystalline semiconductor material and may also repair dangling bonds, such as silicon dangling bonds, in the undoped epitaxial layer 222 and the portion of the substrate directly below the undoped epitaxial layer 222.

In an embodiment, the annealing process 232 includes a rapid thermal anneal (RTA) and a temperature of the RTA is between about 600° C. and about 750° C. for a duration of about 10 seconds to about 5 minutes. Under this annealing condition, the amorphous region 226 may substantially fully recrystallize without introducing significant damage to adjacent features such as the channel layers 208, inner spacer features 220, and/or gate spacers 216. In an alternative embodiment, the annealing process 232 includes a spike rapid thermal anneal (RTA), and a temperature of the spike RTA is between about 990° C. and about 1050° C. for a duration of about 10 microseconds to about 50 microseconds to achieve similar results as the previous described RTA process. In another alternative embodiment, the annealing process 232 includes a microsecond anneal. In yet another alternative embodiment, the annealing process 232 includes a two-step annealing process to achieve solid phase epitaxial regrowth (SPER). The two-step annealing process may include recrystallization of the amorphous region 226 during a first step and an enhancement of the recrystallized undoped epitaxial layer 222 during the second step.

During the annealing process 232, the amorphous region 226 recrystallizes and dislocations 238 are formed along the (111) plane in the recrystallized region 239. The growth of the recrystallized lattice will occur under stress induced by the tensile stress film 228. The (111) plane and a top surface of the substrate 202 form an angle θ of about 50 degrees to about 60 degrees, such as about 55 degrees. Each dislocation 238 starts formation at a corresponding dislocation core 236. The dislocation core 236 is formed in the substrate 202 and under a mesa structure 237 of the substrate such that mesa structure 237 would permanently undergo tensile stress (rather than compressive stress) to enhance the electron mobility as long as the dislocation core 236 is not removed. It is noted that the mesa structure 237 below the dislocation may be under a compressive stress. Electron mobility in the substrate below the mesa structure 237 would be decreased due to the compressive stress. The dislocation core 236 is described in further detail with reference to FIG. 14. It is understood that, FIG. 10 is a fragmentary cross-sectional view of the workpiece 200. In a three-dimensional view, the dislocation 238 is a plane that extends along the (111) plane.

Figure 11:
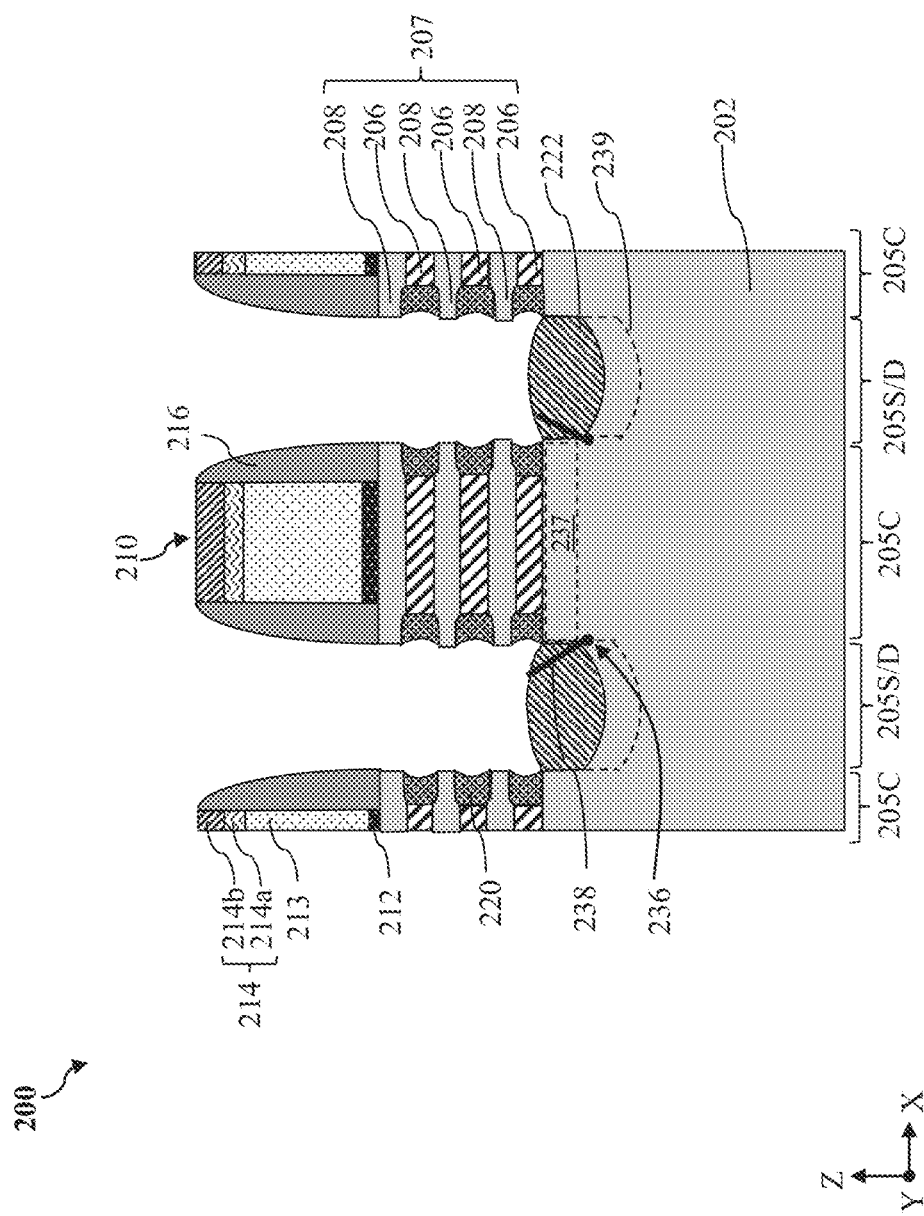

Referring to FIGS. 1 and 11, method 100 includes a block 116 where the tensile stress film 228 is selectively removed from the workpiece 200. Since the recrystallized region 239 memorizes the stress induced by the tensile stress film 228, when the tensile stress film 228 is removed, the recrystallized region 239 maintains the stressed lattice configurations. The tensile stress film 228 may be removed by an etching process. In some embodiments, the etching process may include a wet etching, such as using phosphoric acid or hydrofluoric acid, or by a combination of dry etching and wet etching.

Figure 12:
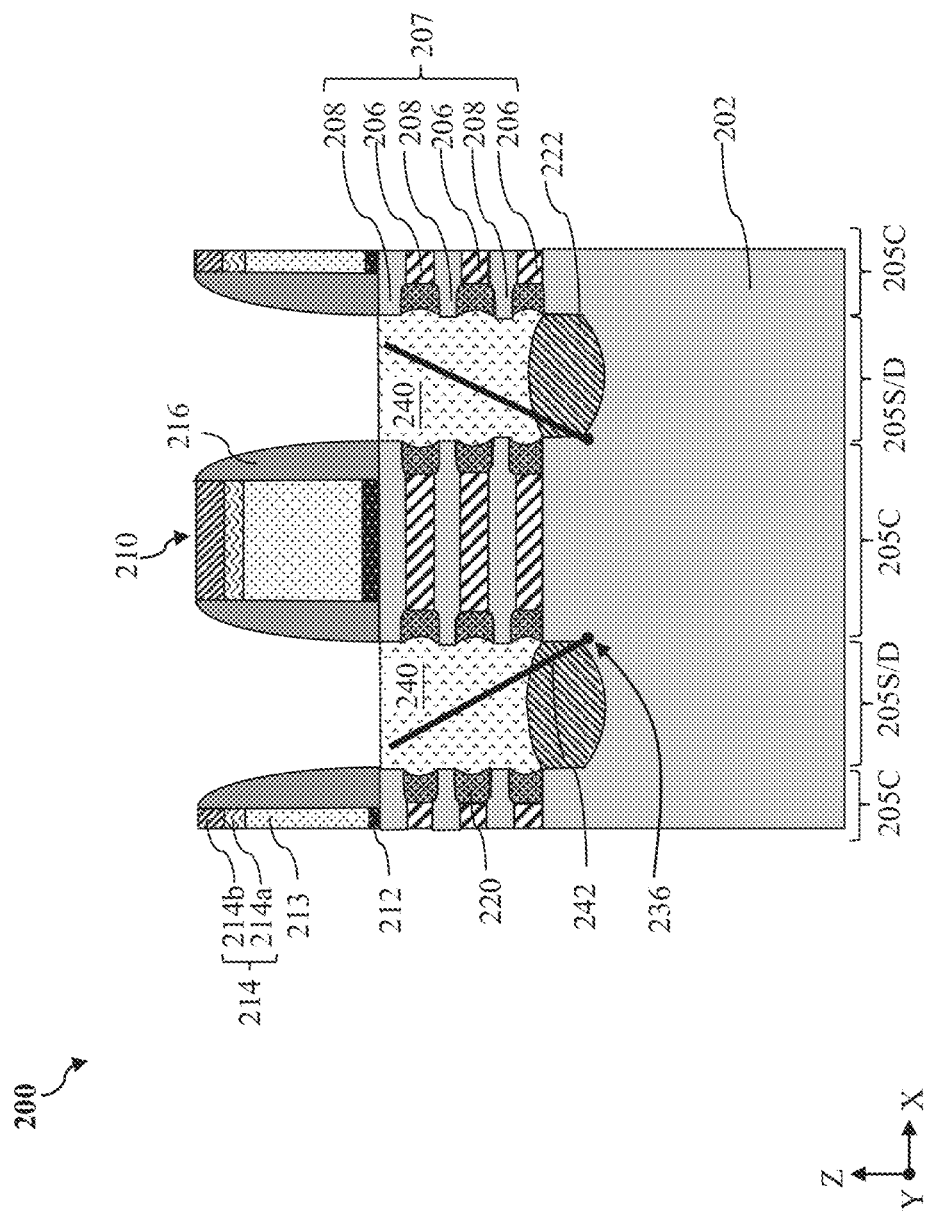

Referring to FIGS. 1 and 12, method 100 includes a block 118 where source/drain features 240 are formed in the source/drain openings 218 and over the undoped epitaxial layers 222. The source/drain features 240 track the shapes of the source/drain openings 218 not filled by the undoped epitaxial layers 222 and each have a width Dc ranged between about 20 nm and about 40 nm. The source/drain features 240 may include a heavily doped epitaxial layer. In some embodiments, the source/drain features 240 may include epitaxial silicon, carbon doped silicon (Si:C), phosphorus doped silicon (Si:P), or carbon and phosphorus doped silicon. In this depicted example, the source/drain features 240 are n-type and may include silicon (Si) doped with an n-type dopant, such as phosphorus (P) or arsenic (As). Doping of the source/drain features 240 may be performed either in situ with their deposition or ex situ using an implantation process, such as a junction implant process. The source/drain features 240 each may be formed using an epitaxial process, such as VPE, UHV-CVD, MBE, and/or other suitable processes. The source/drain features 240 are therefore coupled to the channel layers 208 in the channel regions 205C of the fin-shape structure 205. Since the source/drain features 240 are epitaxially formed and the recrystallized region 239 maintains the stressed lattice configurations, the dislocations 238 continue to grow along the (111) plane and extends into the source/drain features 240 to form dislocations 242. That is, the dislocations 242 also extend along the (111) plane. Operations described in block 112, 114, 116, and 118 may be applied to the enlarged amorphous region 226' to obtain satisfactory dislocations and carrier mobility enhancement.

Figure 13:
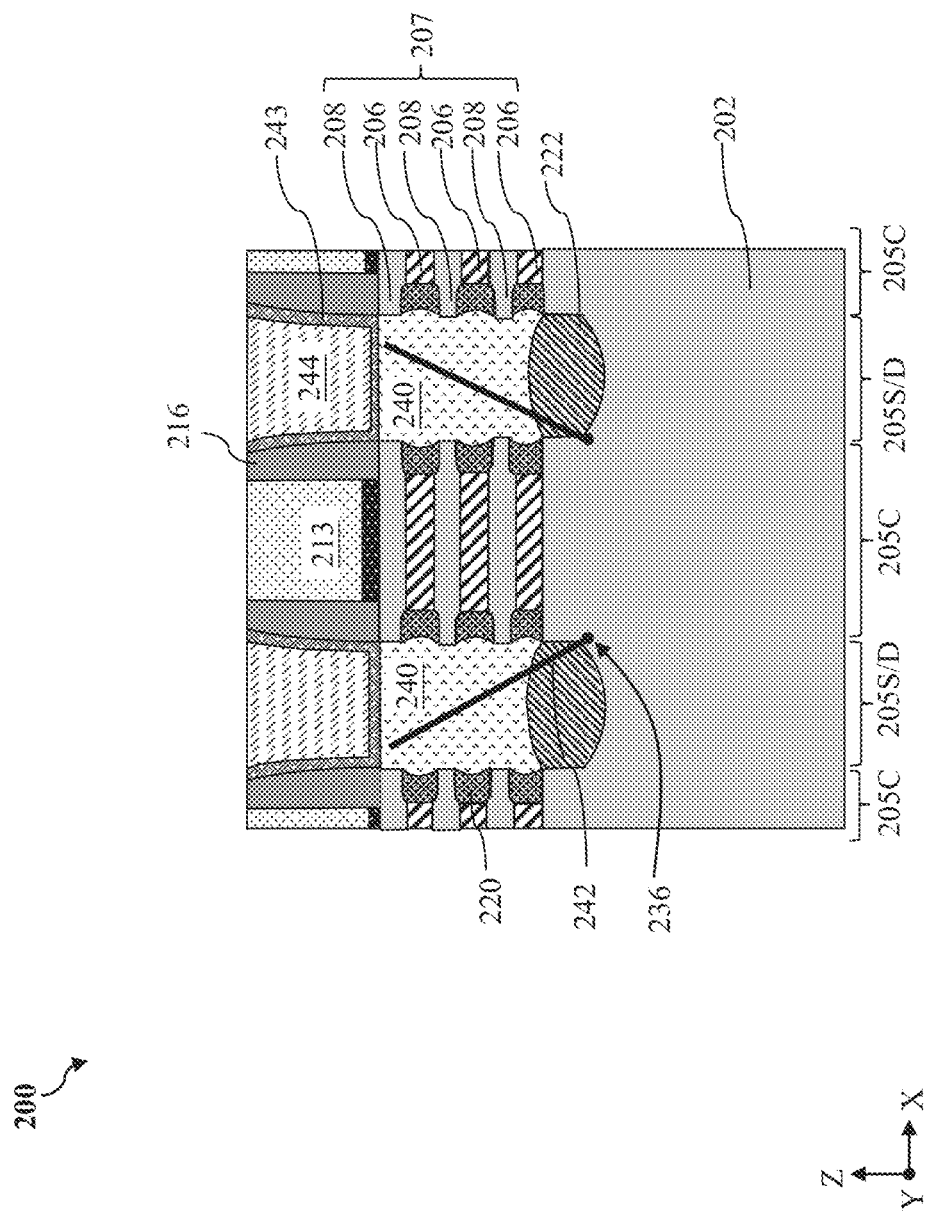

Referring to FIGS. 1 and 13, method 100 includes a block 120 where a contact etch stop layer (CESL) 243 and a bottom interlayer dielectric (ILD) layer 244 are deposited over the workpiece 200. The CESL 243 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 13, the CESL 243 may be conformally deposited on the top surface of the source/drain features 240 and sidewalls of the gate spacers 216. The bottom ILD layer 244 is deposited by a PECVD process or other suitable deposition technique over the workpiece 200 after the deposition of the CESL 243. The bottom ILD layer 244 may include materials such as tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be performed to remove excessive materials and expose top surfaces of the dummy gate electrode layer 213 in the dummy gate stacks 210.

Figure 14:
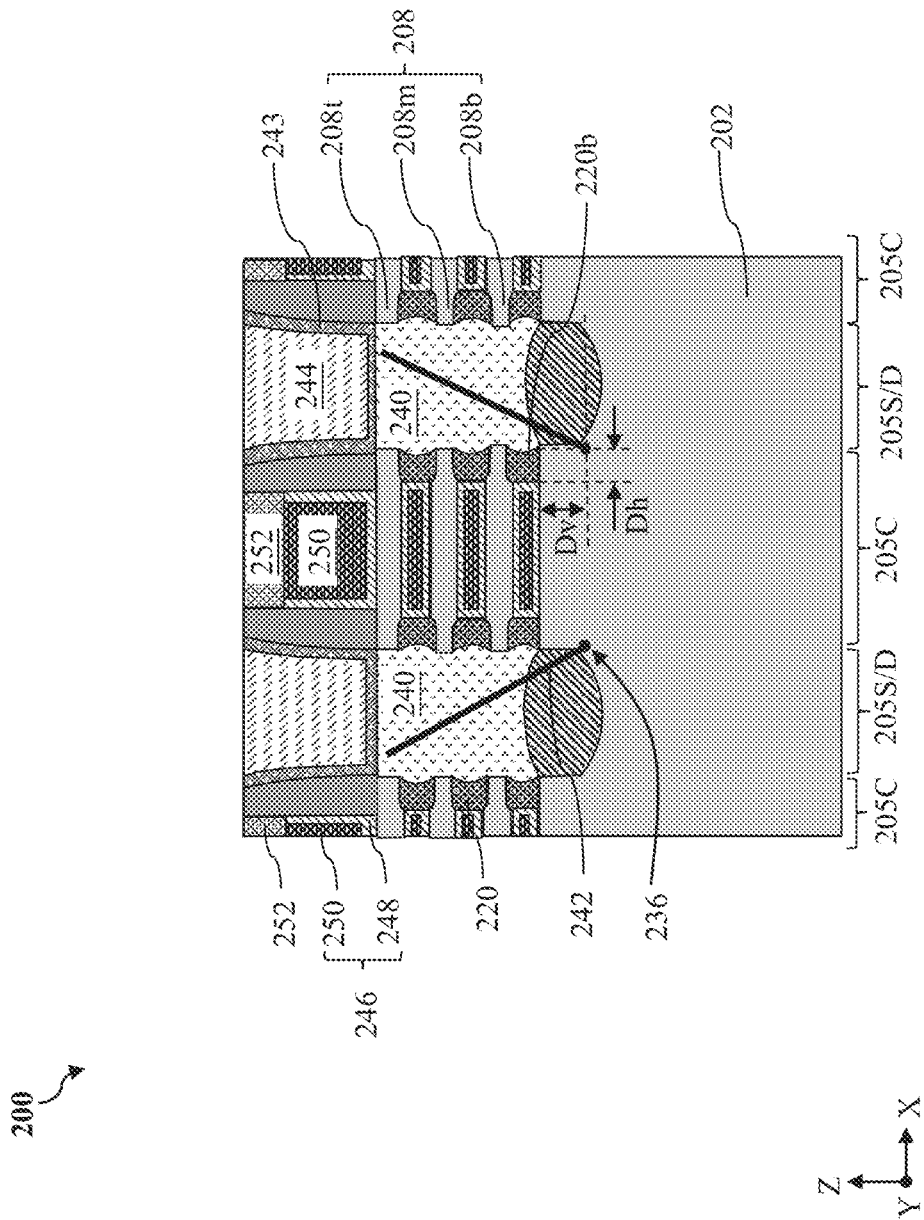

Referring to FIGS. 1 and 14, method 100 includes a block 122 where the dummy gate stacks 210 are replaced with the gate structures 246. With the exposure of the dummy gate electrode layer 213, block 122 proceeds to removal of the dummy gate stacks 210. The removal of the dummy gate stacks 210 may include one or more etching process that are selective to the materials in the dummy gate stacks 210. After the removal of the dummy gate stacks 210, the sacrificial layers 206 are selectively removed to release the channel layers 208 as channel members 208 in the channel regions 205C. The channel members 208 include a topmost channel member 208$t$, a bottommost channel member 208$b$, and a middle channel member 208$m$. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

The gate structures 246 are deposited to wrap over the channel members 208. Each of the gate structures 246 includes a gate dielectric layer 248 and a gate electrode layer 250 over the gate dielectric layer 248. In some embodiments, the gate dielectric layer 248 includes an interfacial layer disposed on the channel members 208 and a high-k dielectric layer over the interfacial layer using ALD, CVD, and/or other suitable methods. Here, a high-k dielectric layer refers to a dielectric material having a dielectric constant greater than that of silicon dioxide, which is about 3.9. In some embodiments, the interfacial layer includes silicon oxide. The high-k dielectric layer may include hafnium oxide. Alternatively, the high-k dielectric layer may include other high-k dielectrics, such as titanium oxide, zirconium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer 250 is then deposited over the gate dielectric layer 248 using ALD, PVD, CVD, e-beam evaporation, or other suitable methods. The gate electrode layer 250 may include a single layer or alternatively a multi-layer structure, such as various combinations of a metal layer with a selected work function to enhance the device performance, a liner layer, a wetting layer, an adhesion layer, a metal alloy or a metal silicide. By way of example, the gate electrode layer 250 may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof.

The gate structure 246 includes a first portion disposed between the source/drain features 240 and a second portion disposed over a topmost channel member 208$t$. A horizontal distance Dh between the dislocation core 236 and the first portion of the gate structure 246 is between about 0.5 nm and 10 nm. If the horizontal distance Dh is less than 0.5 nm, the propagation of the dislocations may be stopped by the bottommost inner spacer feature 220$b$ and thus cannot extend into the source/drain features 240 to improve the carrier mobilities in the channel members 208. When the horizontal distance Dh is greater than 10 nm, the associated strain efficiency to the channel members 208 decreases, leading to unsatisfactory carrier mobility enhancement. A vertical distance Dv between a bottommost inner spacer feature 220$b$ and the dislocation core 236 is between about 10 nm and 30 nm such that the dislocation core 236 is formed under the mesa structure 237 (shown in FIG. 10) and the dislocation 242 would induce satisfactory stress and satisfactory carrier mobility in the channel members 208. It is noted that, since the dislocation 242 extends along the (111) plane and into the source/drain feature 240, the carrier mobility in each channel member is not uniform. More specifically, the carrier mobility in each channel member is a function of a vertical distance between that channel member and the dislocation core 236. The shorter the vertical distance between the channel member and the dislocation core 236, the greater carrier mobility in that channel member. In other words, the increased electron mobility in the channel members due to the dislocation tensile stress gradually reduces with the vertical distance from the dislocation core 236. In the embodiment illustrated in FIG. 14, the carrier (e.g., electron) mobility of the bottommost channel member 208$b$ is greater than that of the middle channel member 208$m$, and the carrier mobility of the middle channel member 208$m$ is greater than that of the topmost channel member 208$t$.

In some embodiments, the workpiece 200 also includes a self-aligned capping (SAC) layer 252 formed directly over the gate structure 246. In some embodiments, the SAC layer 252 may be also formed directly over the gate electrode layer 250. In an embodiment, the SAC layer 252 includes silicon nitride. In some other embodiments, the SAC layer 252 may be formed of hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon oxycarbonitride, silicon, zirconium nitride, silicon carbonitride or combinations thereof.

Figure 15:
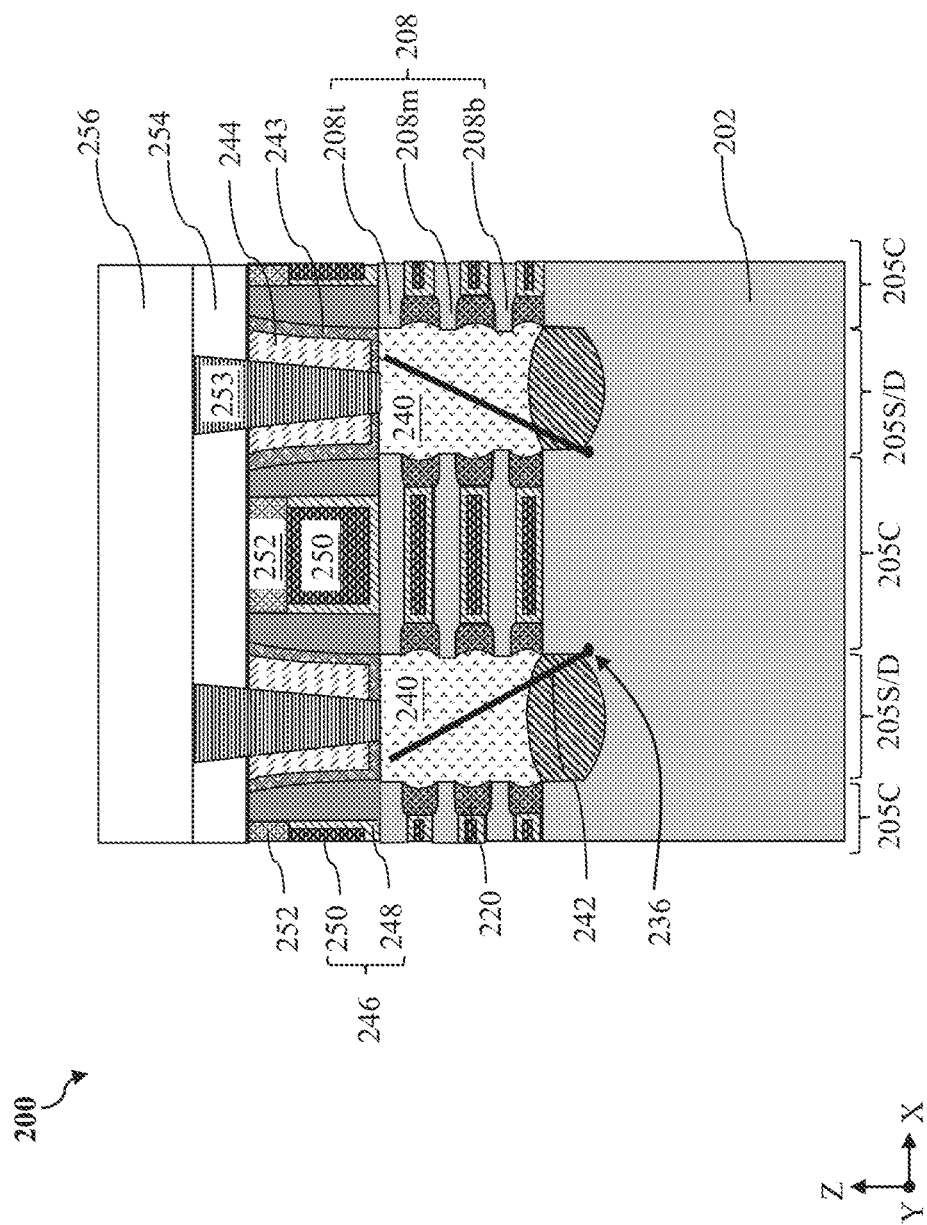
Figure 16:
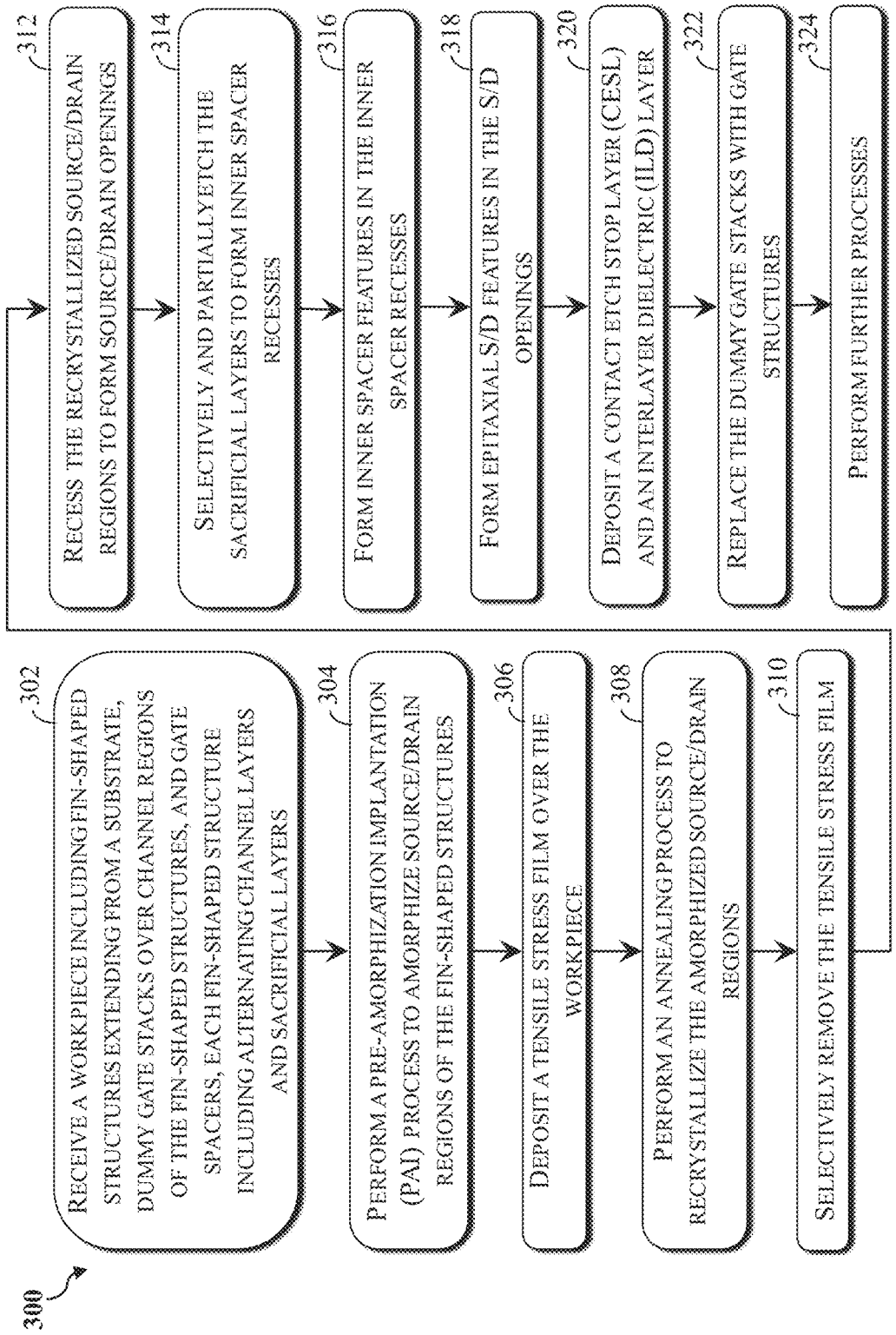
FIG. 16 illustrates a flow chart of another exemplary method for forming a semiconductor device, according to one or more aspects of the present disclosure.

Referring to FIGS. 1 and 15, method 100 includes a block 124 where further processes may be performed to complete the fabrication of the semiconductor device 200. Such further processes may include forming various features such as ILD layer 254, contacts (e.g., source/drain contacts 253), as well as other multilayer interconnect structure 256 including metal lines, power rails, and/or vias over the semiconductor device 200, configured to connect the various features to form a functional circuit that includes the different semiconductor devices.

The present disclosure also includes another method 300 of forming a semiconductor device 400 with enhanced carrier mobility. Now referring to FIGS. 16 and 17, method 300 includes a block 302 where a workpiece 400 is received. The workpiece 400 is similar to the workpiece 200 shown in FIG. 3. Descriptions of materials and fabrication processes of similar features are omitted for reason of simplicity.

Figure 17:
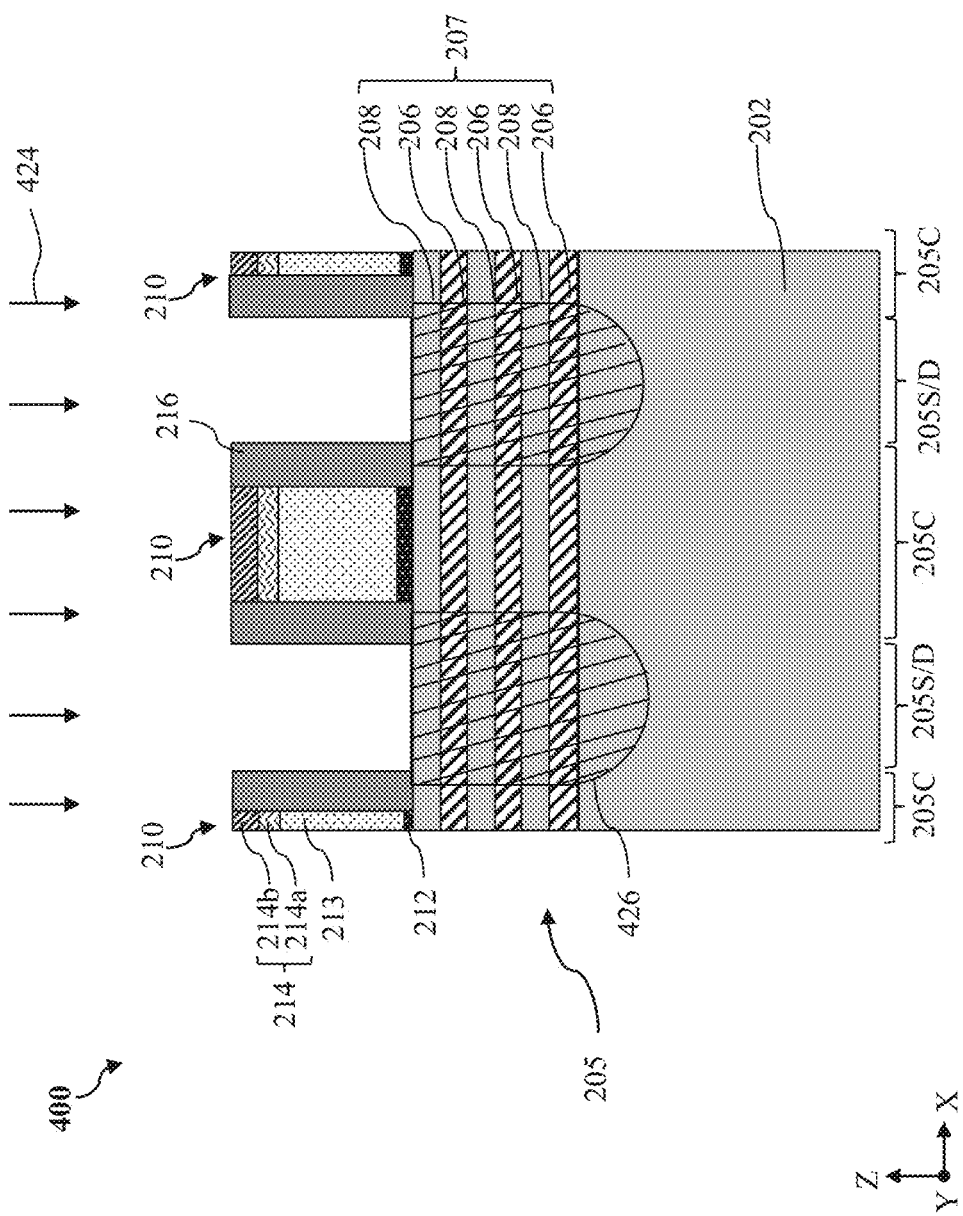
FIGS. 17-25 illustrate fragmentary cross-sectional views of an exemplary workpiece during various fabrication stages in the method of FIG. 16, according to one or more aspects of the present disclosure.

Still referring to FIGS. 16 and 17, method 300 includes a block 304 where a PAI process 424 is performed to amorphize the source/drain regions 205S/D of the fin-shaped structures 205 to form amorphous region 426. The PAI process 424 implants the source/drain regions 205S/D and a portion of the substrate 202 under the source/drain regions 205S/D with an implant species, randomizing the lattice structure and forming an amorphous region 426. In PAI process 424, the implant species may include Si, C, Ge, Xe, Ar, or other suitable species. In this depicted embodiment, the PAI process 424 implants Ge at an implant energy from about 25 KeV to about 55 KeV, a dosage in a range from about 1 E14 atoms/cm$^2$ to about 5 E15 atoms/cm$^2$, a temperature in a range from about −100° C. to about 25° C., and an implant angle (an angle between the implant ion beam and the Z axis) between about 0° and about 10°. The implant energy in the PAI process 424 is higher than the implant energy in the PAI process 224. In some embodiments, the PAI process 424 includes several PAI processes with different implant angles and/or different implant species. After the PAI process 424, a shape of the cross-sectional view of the amorphous region 426 includes two substantially vertical sidewalls 226s, a flat top surface (coplanar with a top surface of the topmost channel layer), and a concave bottom surface. In embodiment represented in FIG. 17, at least a portion of the gate spacer 216 is disposed directly over and on the amorphous region 426.

Figure 18:
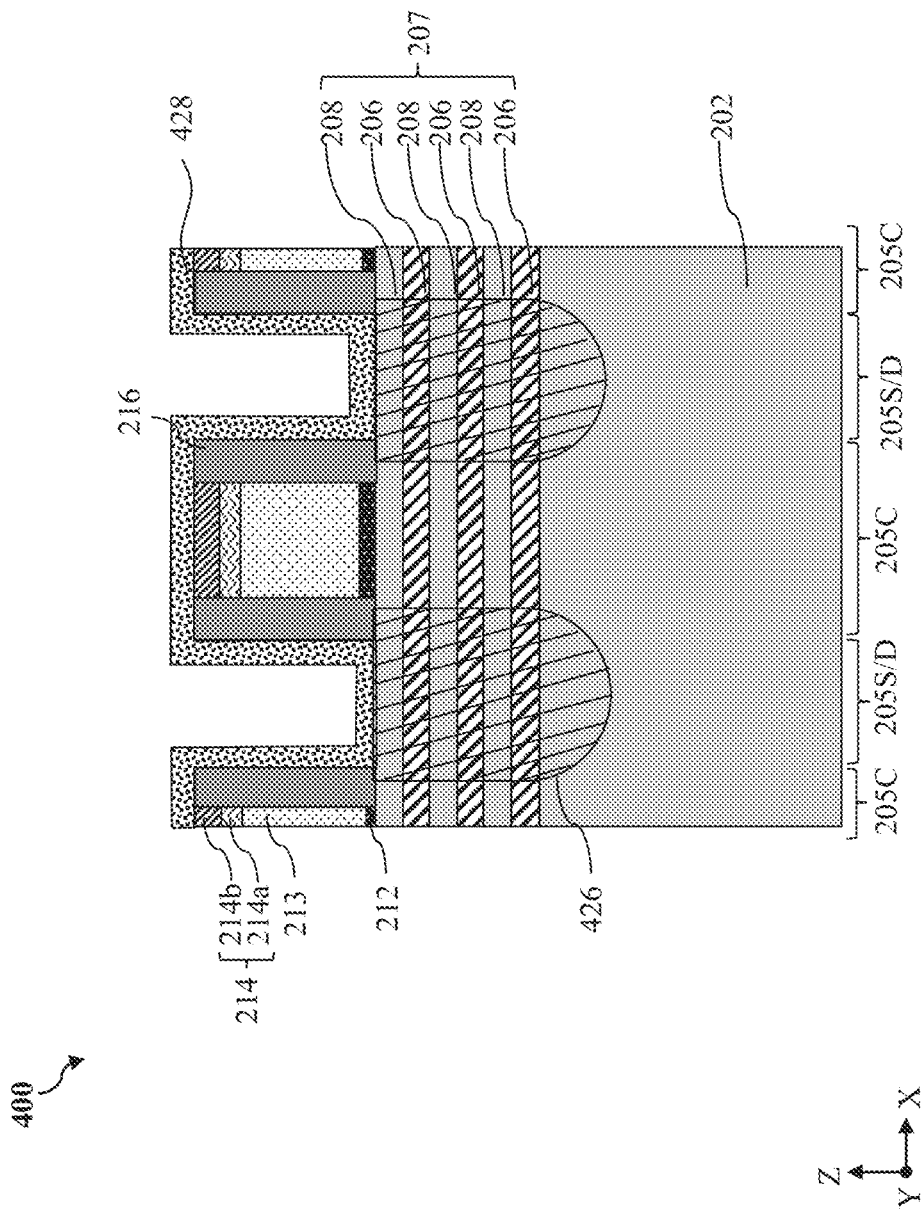

Referring to FIGS. 16 and 18, method 300 includes a block 306 where a tensile stress film 428 is deposited over the workpiece 400. The material, thickness, and fabrication process of forming the tensile stress film 428 may be in a way similar to those of the tensile stress film 228.

Figure 19:
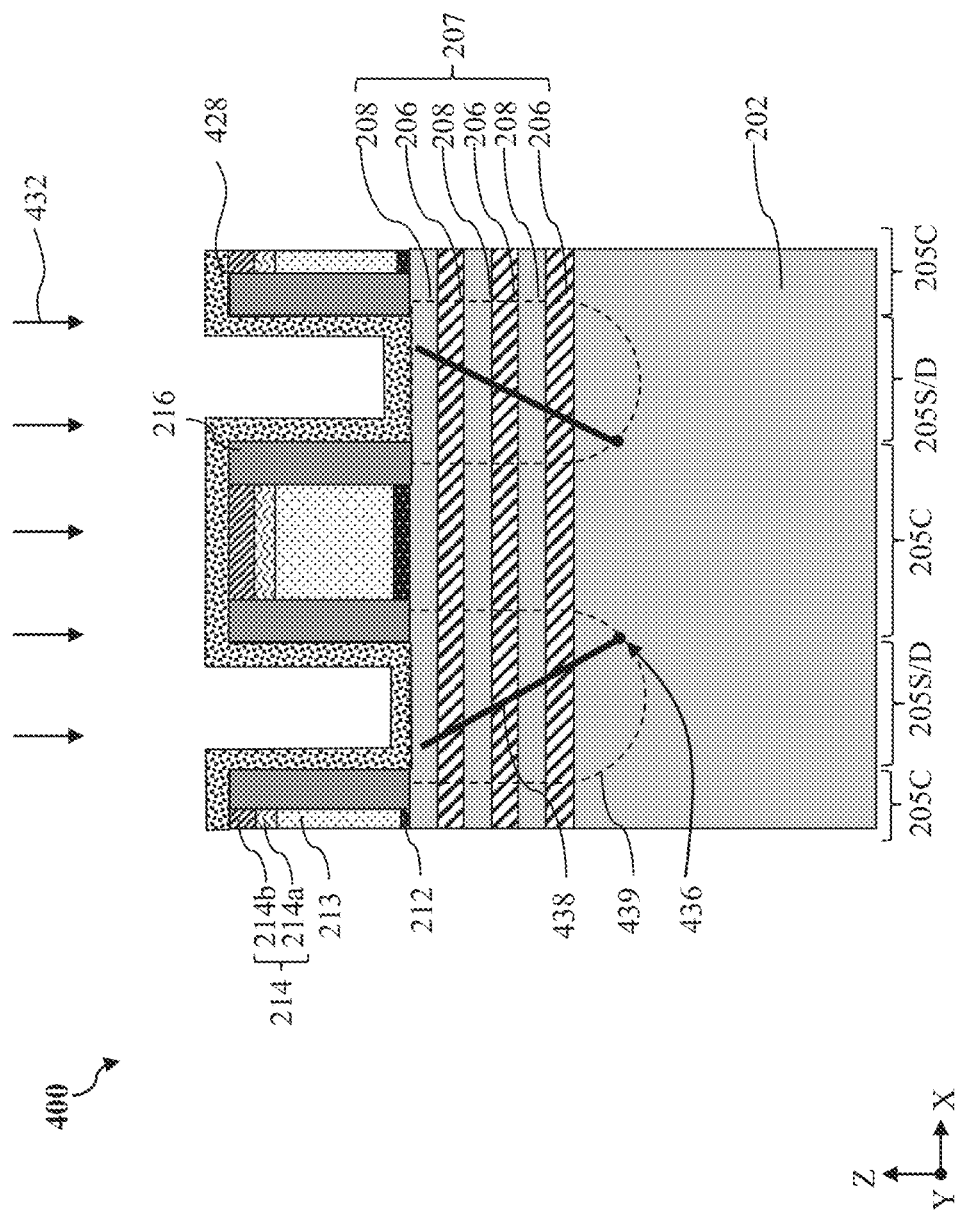

Referring to FIGS. 16 and 19, method 300 includes a block 308 where an annealing process 432 is performed to recrystallize the amorphous region 426. The annealing process 432 may be in a way similar to the annealing process 232 described with reference to FIG. 10. The annealing process 432 would convert (crystallize) the amorphous region 426 into crystalline semiconductor region 439 and may also repair dangling bonds, such as silicon dangling bonds, in the crystalline semiconductor region 439. During the annealing process 432, the amorphous region 426 recrystallizes and dislocations 438 are formed in the (111) plane and in the recrystallized regions 439. The growth of the recrystallized lattice will occur under stress conditions induced by the tensile stress film 428. The dislocation 438 starts forming at a dislocation core 436 and extends into the recrystallized region 439. As described above in association with block 304, a portion of the amorphous region 426 is disposed under the gate spacers 216. That configuration helps to ensure that the dislocation cores 436 are also disposed under the gate spacers 216 and are therefore protected by the gate spacers 216 during an anisotropic etching process, such as one used to recess the source/drain regions 205S/D at block 312.

Figure 20:
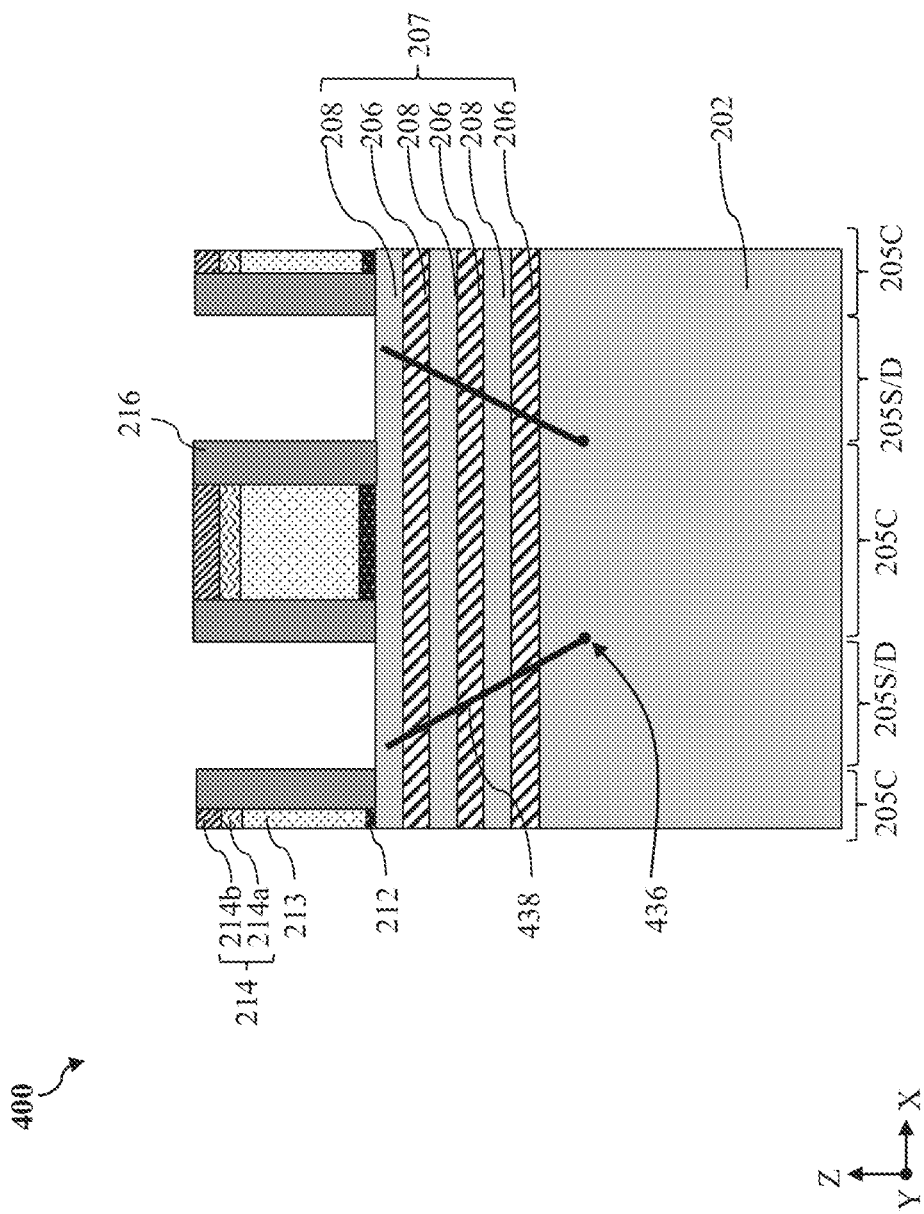

Referring to FIGS. 16 and 20, method 300 includes a block 310 where the tensile stress film 428 is selectively removed. The tensile stress film 428 may be removed by an etching process. The etching process may be in a way similar to the etching process described with reference to FIG. 11. Since the dislocations 438 are formed and the recrystallized region 439 memorizes the stress induced by the tensile stress film 428, when the tensile stress film 428 is removed, the recrystallized region 439 maintains the stressed lattice configurations.

Figure 21:
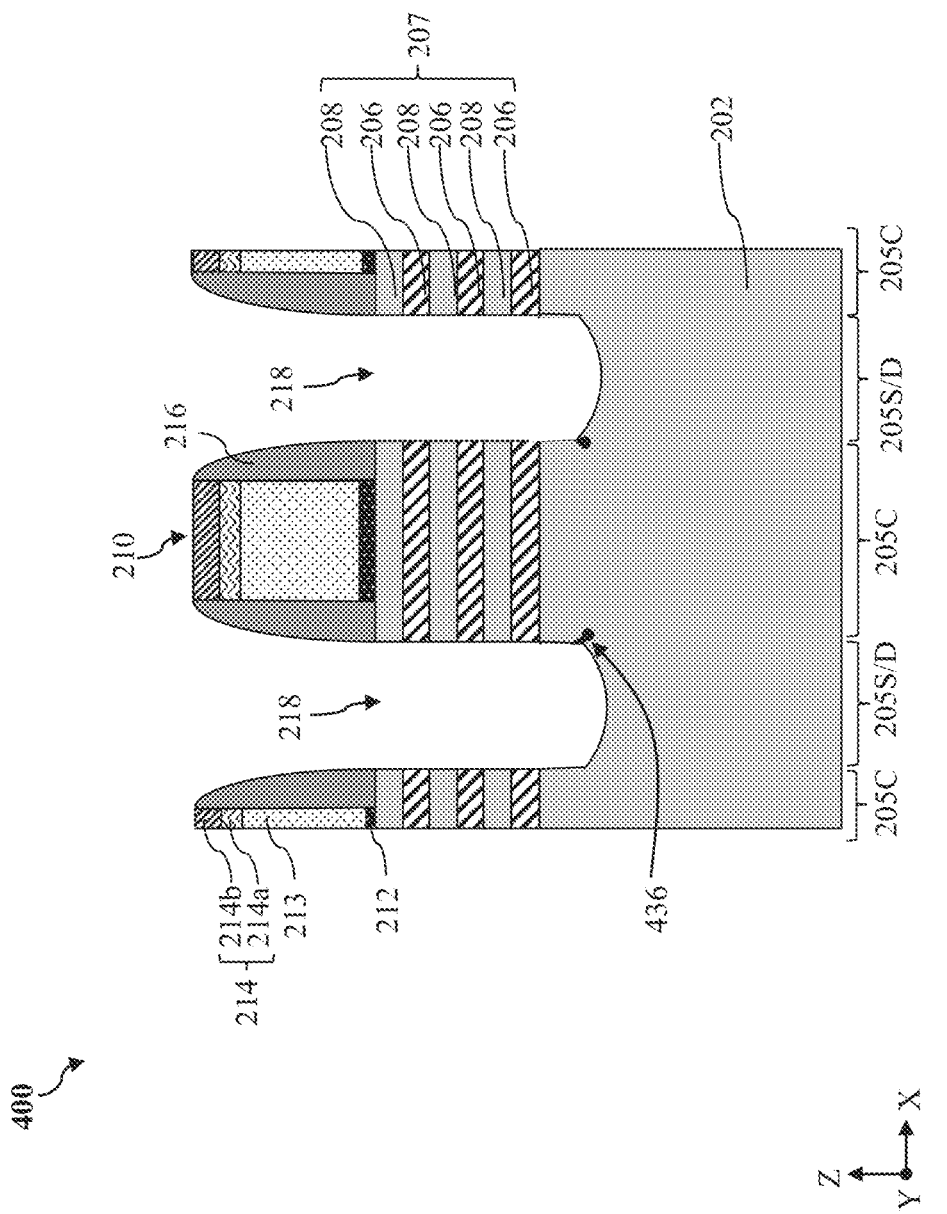

Referring to FIGS. 16 and 21, method 300 includes a block 312 where source/drain regions are recessed to form the source/drain openings 218. In embodiments represented in FIG. 21, the source/drain openings 218 extend through the vertical stack 207 and partially extend into the substrate 202. During the formation of the source/drain openings 218, the gate spacers 216 may be slightly etched. It is noted that, the etching process implemented in block 312 does not remove the dislocation core 436.

Figure 22:
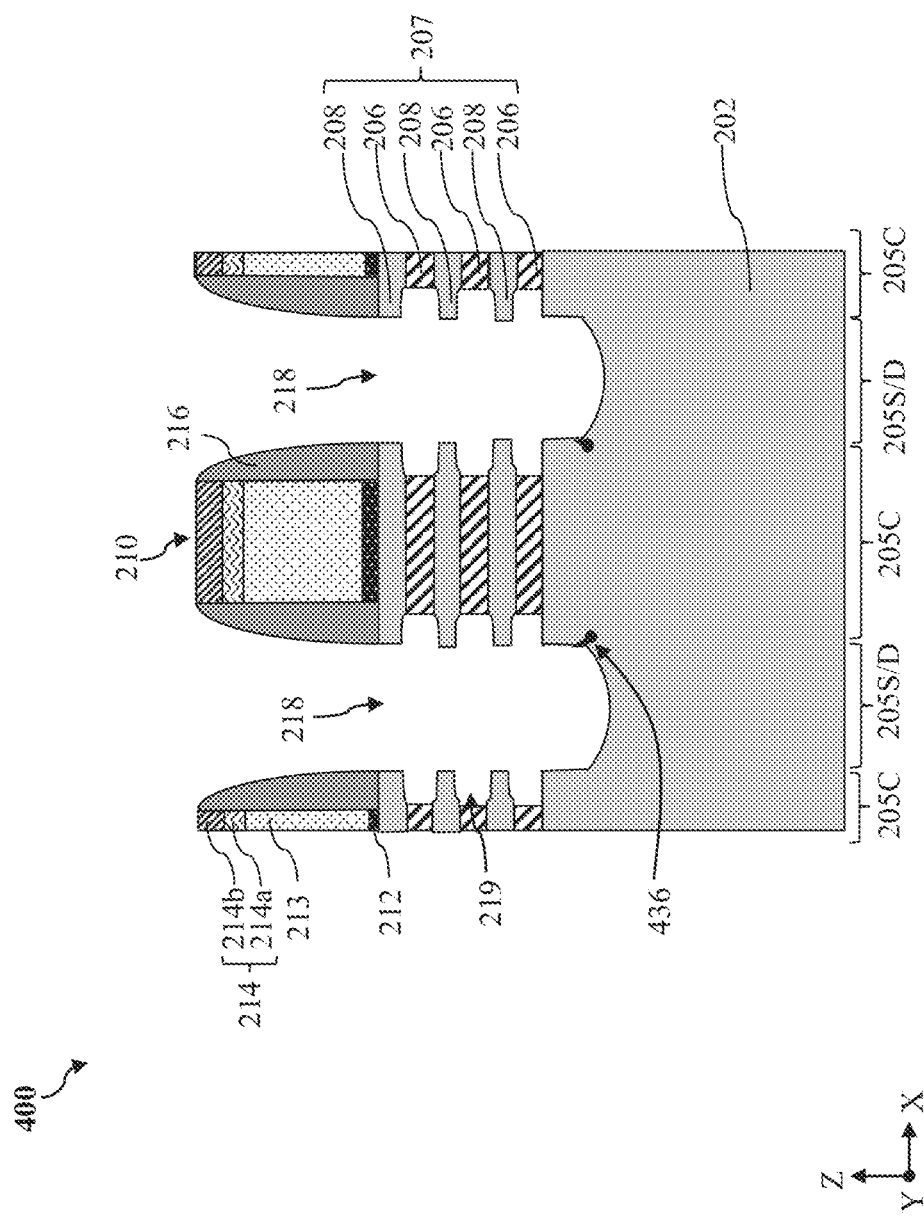
Figure 23:
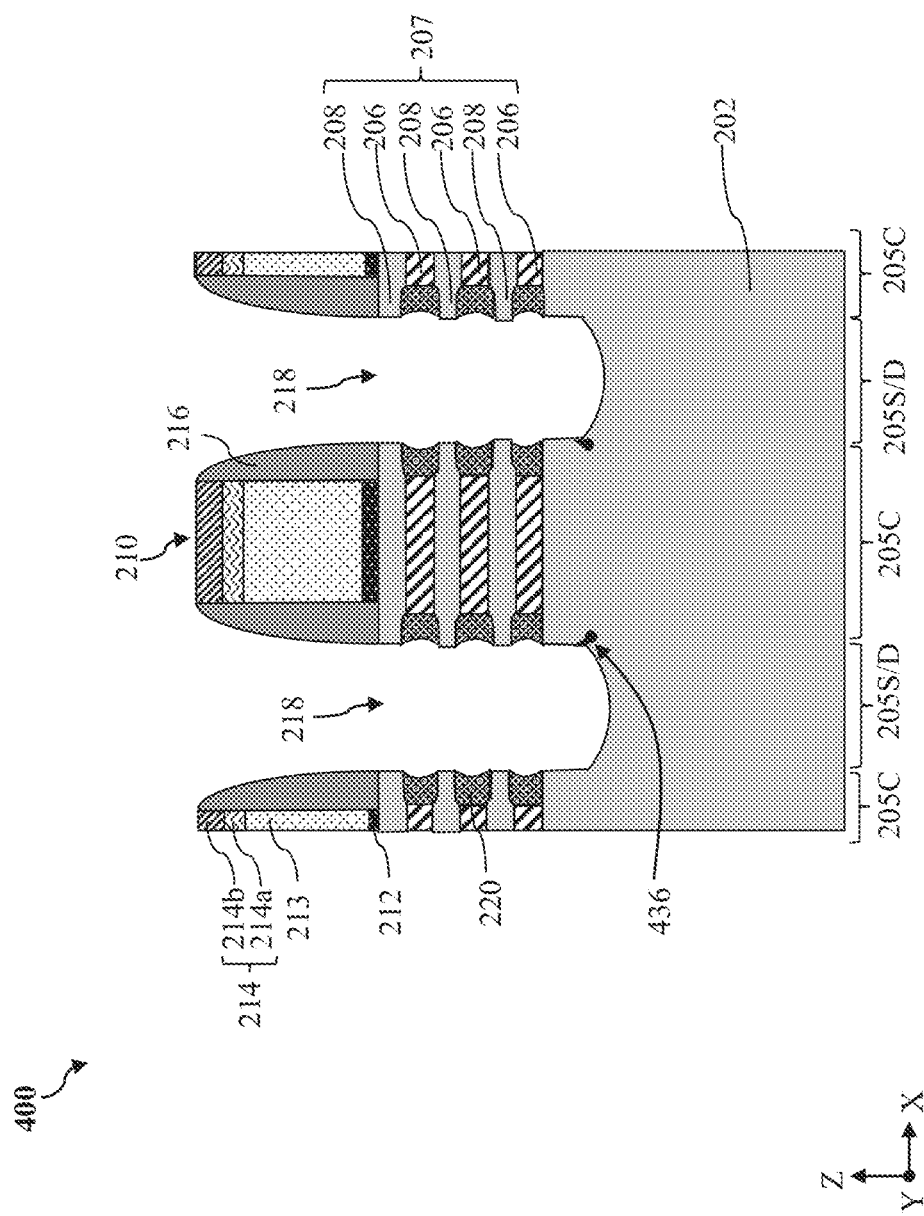

Referring to FIGS. 16 and 22, method 300 includes a block 314 where the sacrificial layers 206 are selectively and partially recessed to form inner spacer recesses 219. Referring to FIGS. 16 and 23, method 300 includes a block 316 where inner spacer features 220 are formed in the inner spacer recesses 219. The formation of the inner spacer recesses 219 and inner spacer features 220 are omitted for reason of simplicity. It is noted that, since the PAI process 432 is performed before the formation of the inner spacer feature 220, the inner spacer feature 220 may not include implant species used in the PAI process 432.

Figure 24:
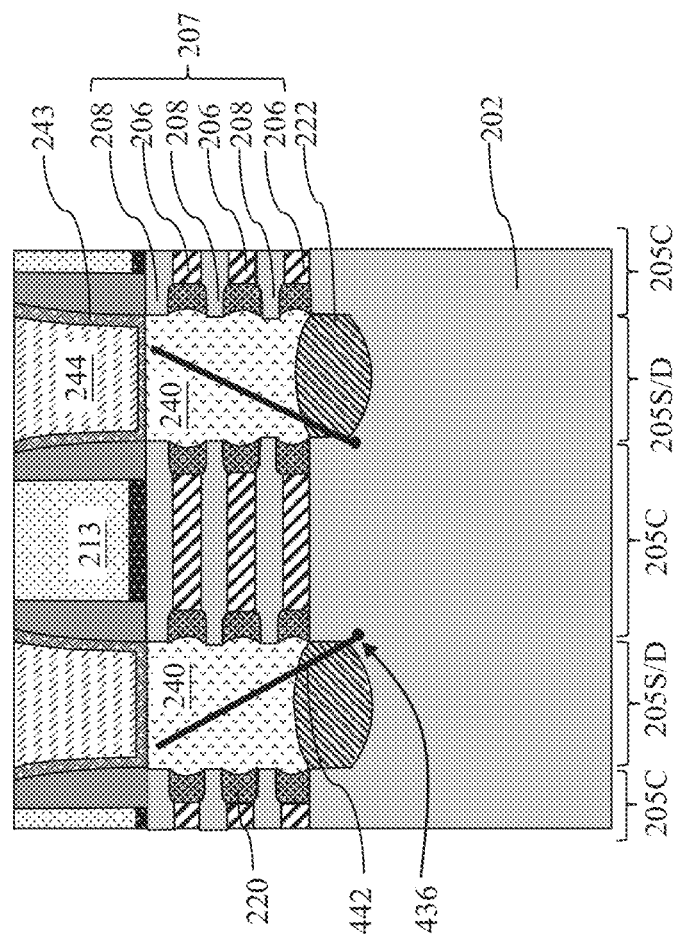

Referring to FIGS. 16 and 24, method 300 includes a block 318 where epitaxial source/drain features 240 are formed over the source/drain openings 218. An undoped epitaxial layer 222 may be formed over the source/drain openings 218 and configured to reduce or even prevent leakage current between the to-be-formed source/drain features and the well regions in the substrate 202. The source/drain features 240 may be then formed over the undoped epitaxial layer 222 and fill the source/drain openings 218. The materials and formation of the undoped epitaxial layer 222 and the source/drain features 240 are omitted for reason of simplicity. Since dislocation cores 436 remain in the workpiece 400, and the undoped epitaxial layer 222 and the source/drain features 240 are epitaxially formed, dislocations would grow along the (111) plane and extend into the undoped epitaxial layer 222 and the source/drain features 240 to form dislocations 442.

Figure 25:
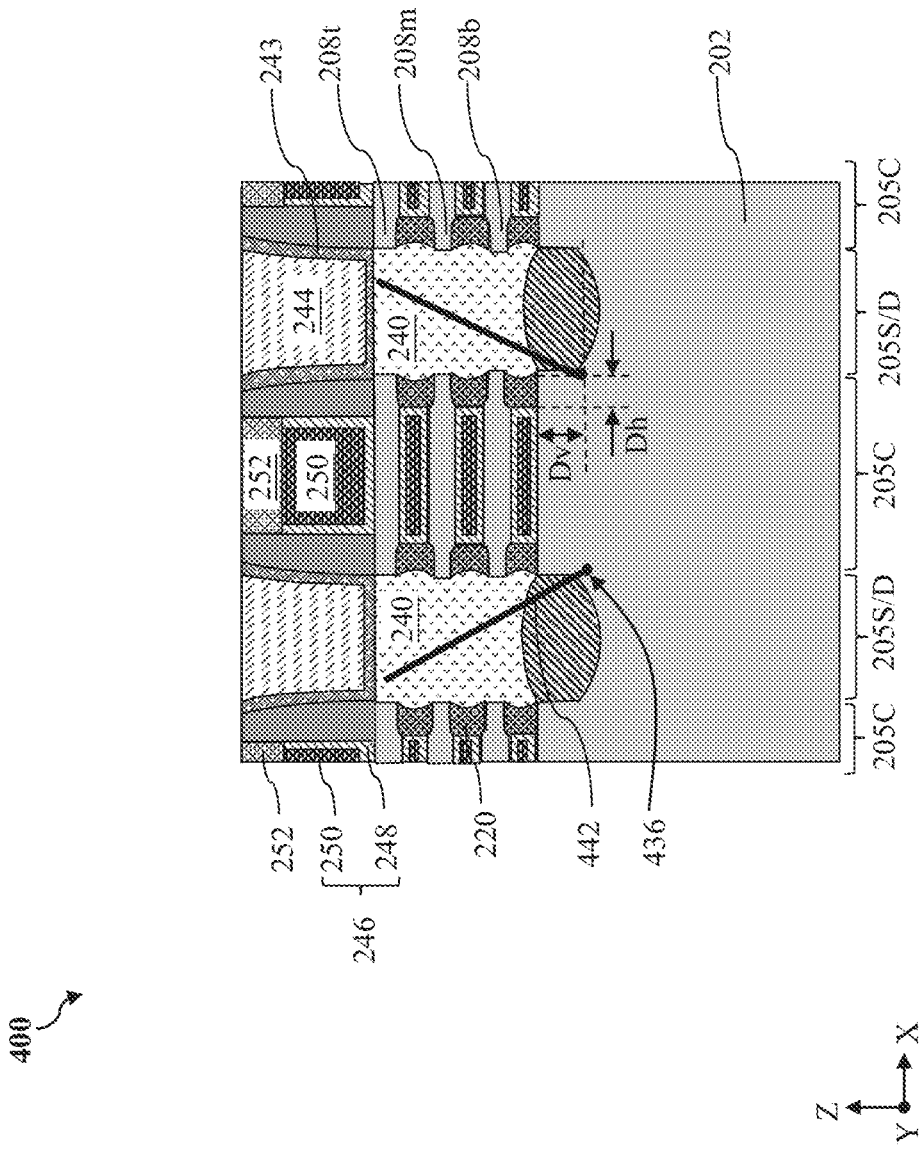

Still referring to FIGS. 16 and 24, method 300 includes a block 320 where the contact etch stop layer (CESL) 243 and the bottom interlayer dielectric (ILD) layer 244 are deposited over the workpiece 400. Referring to FIGS. 16 and 25, method 300 includes a block 322 where the dummy gate stacks 210 are replaced with the gate structures 246. The formation of the CESL 243, ILD layer 244, and the replacement of the gate structures 246 are omitted for reason of simplicity. Method 300 also includes a block 324 where further processes may be performed to complete the fabrication of the semiconductor device 400. Such further processes may include forming various contacts/vias, metal lines, power rails, as well as other multilayer interconnect features, such as ILD layers and/or etch stop layer (ESLs) over the semiconductor device 400, configured to connect the various features to form a functional circuit that includes the different semiconductor devices.

In the above described embodiments, the semiconductor device 200/400 includes two dislocations 242/442 each extending along the (111) plane and into one of the source/drain features 240. It is noted that, the semiconductor device 200/400 may include more than two dislocations 242/442 and two of the dislocations may intersect in the source/drain features 240. Despite different configurations of the intersecting dislocations 242/442, at least a portion of the channel members (e.g., the channel members disposed below the intersection node of the two intersected dislocations) would have enhanced carrier mobility, comparing to those devices free of the intentionally formed dislocations 242/442.

Figure 26:
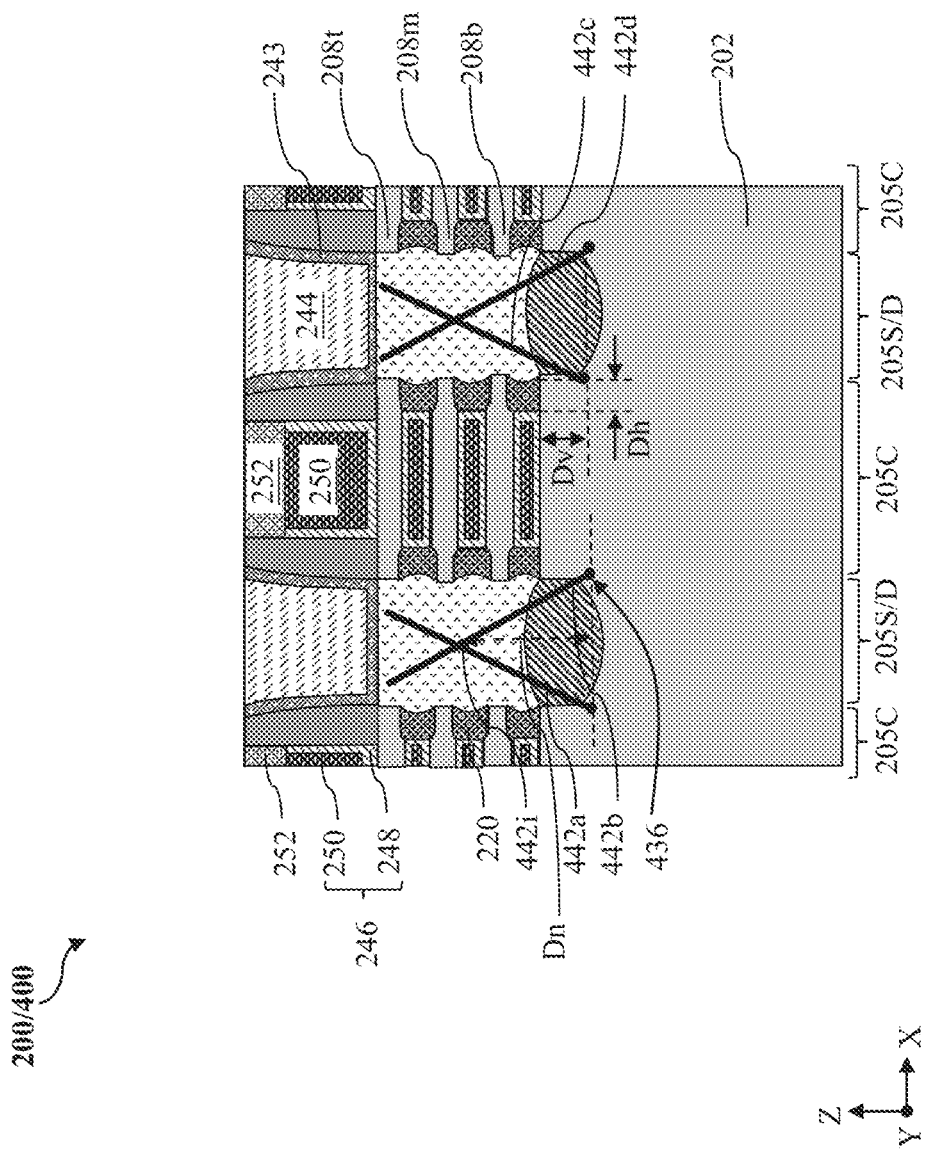
FIGS. 26-32 illustrate alternative embodiments of semiconductor devices having different configurations, according to one or more aspects of the present disclosure.

For example, as shown in FIG. 26, the semiconductor device 400 includes four dislocations 442a, 442b, 442c, and 442d (may be collectively referred to as dislocations 442) extending along the (111) plane. Dislocation 442a intersects dislocation 442b, and dislocation 442c intersects dislocation 442d. After the intersection, each of the dislocations continues propagating along respective crystal planes and stops at locations near the top surface of the corresponding source/drain feature 240. A vertical distance Dn between the intersection node 442i and a dislocation core 436 is between about 15 nm and about 30 nm. A cross-sectional view of the workpiece 400 includes two x-shaped dislocation patterns, each pattern is formed over the corresponding source/drain region 205S/D. In some embodiments, each of the channel members 208 may have enhanced carrier mobility. In some embodiments, the stresses induced by the intersecting dislocations (e.g., dislocations 442a and 442b, and dislocations 442c and 442d) above the intersection node 442i may cancel one another, in whole or in part. As a result, channel members 208 (e.g., bottommost channel member 208b) disposed below the intersection node 442i may have enhanced carrier mobility while channel members 208 (e.g., topmost channel member 208t) disposed above the intersection node 442i may not have enhanced carrier mobility.

Figure 27:
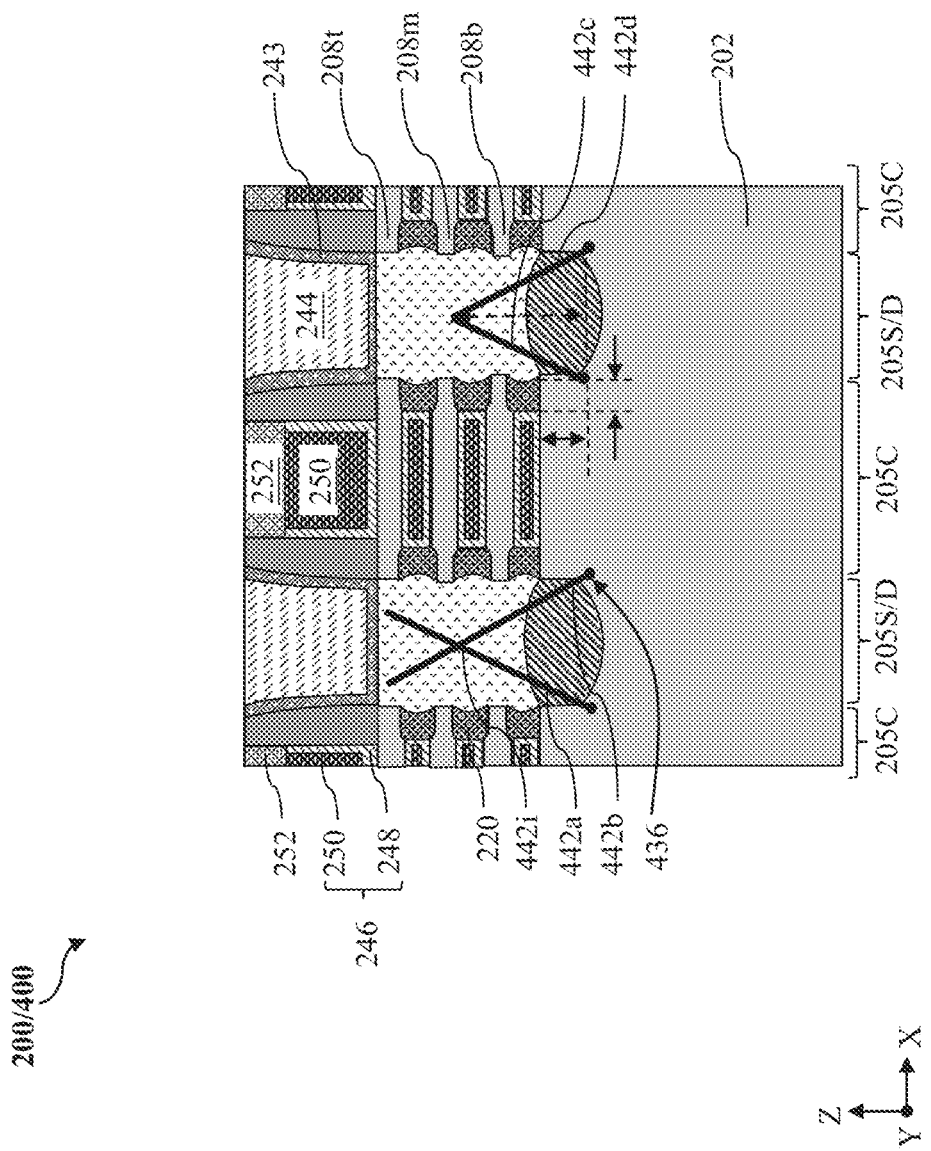

FIGS. 27-31 depict other alternative embodiments of the dislocations formed in the semiconductor device 200/400. For example, as shown in FIG. 27, the workpiece 200/400 includes a dislocation 442a intersecting a dislocation 442b at the intersection node 442i, continue extending along respective crystal plane and stop at locations near the top surface of the source/drain feature 240. The workpiece 200/400 also includes a dislocation 442c intersecting a dislocation 442d. Unlike dislocations 442a and 442b, dislocations 442c and 442d both stop propagating right at the intersection node 442i. A cross-sectional view of the workpiece 200/400 includes an x-shaped dislocation pattern over one of the source/drain region and a herringbone pattern over the other source/drain region 205S/D.

Figure 28:
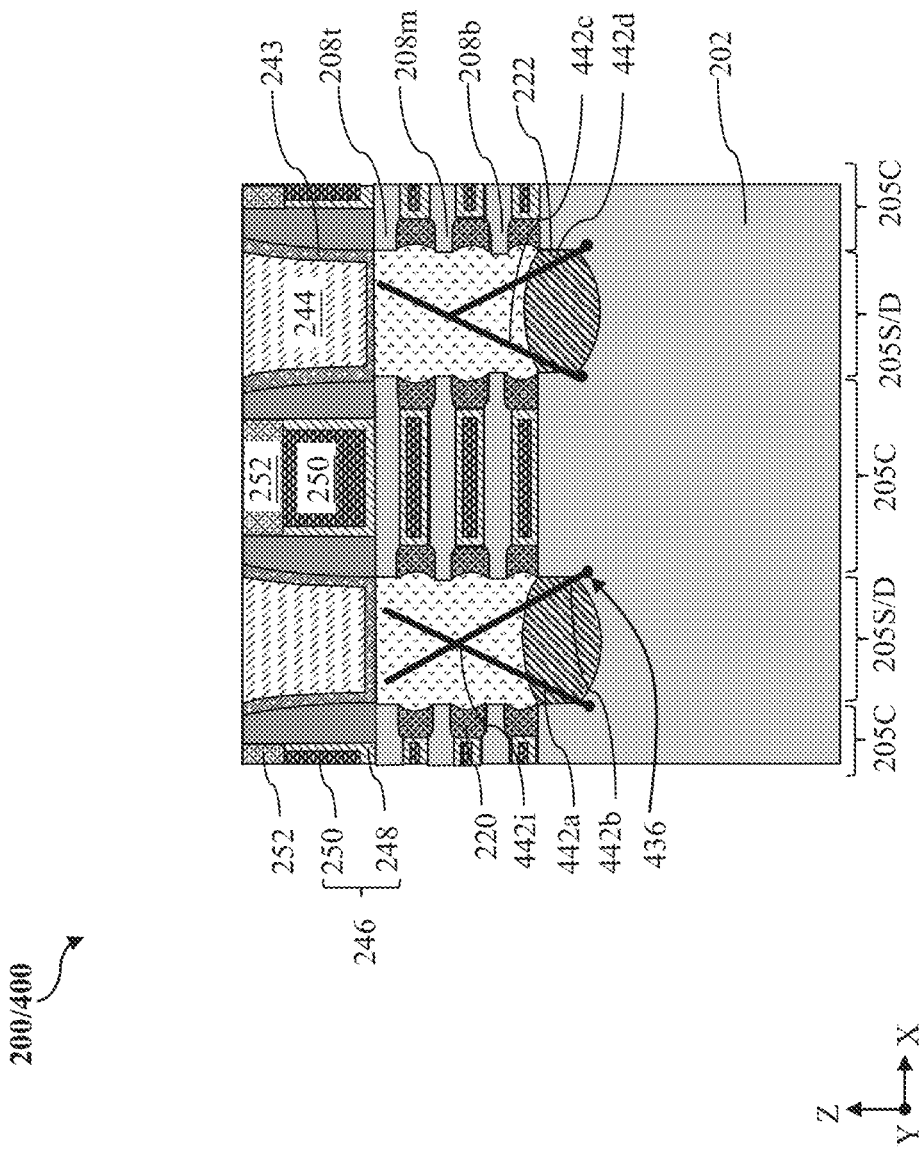

In embodiments represented in FIG. 28, the workpiece 200/400 includes two dislocations 442a and 442b. The two dislocations 442a and 442b intersect at the intersection node 442i, both continue propagating along respective crystal planes, and stop at locations near the top surface of the corresponding source/drain feature 240. The workpiece 200/400 also includes another two dislocations 442c and 442d. Unlike dislocations 442a and 442b, one of the dislocations (e.g., dislocation 442d) of the two dislocations 442c and 442d stops propagating at the intersection node 442i, and the other dislocation (e.g., dislocation 442c) continues propagating along the (111) plane and stop at a location near the top surface of the other source/drain feature 240.

Figure 29:
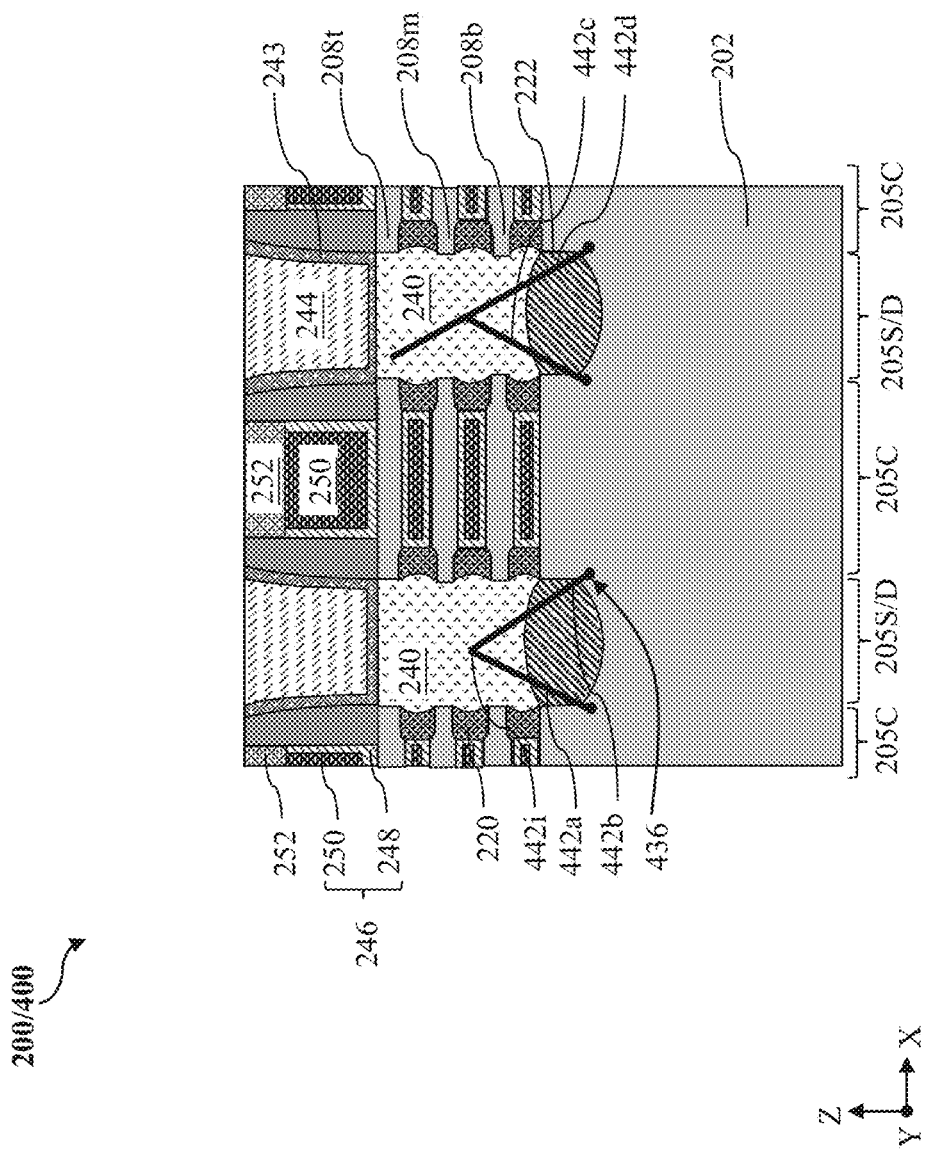

In embodiments represented in FIG. 29, the workpiece 200/400 includes a dislocation 442a intersecting a dislocation 442b and both stop propagating at the intersection node 442i. The workpiece 200/400 also includes a dislocation 442c intersecting a dislocation 442d. Unlike dislocations 442a and 442b, one of the dislocations (e.g., dislocation 442c) stops propagating at the intersection node 442i, and the other dislocation (e.g., dislocation 442d) continues propagating along the (111) plane and stops at a location near the top surface of the other source/drain feature 240.

Figure 30:
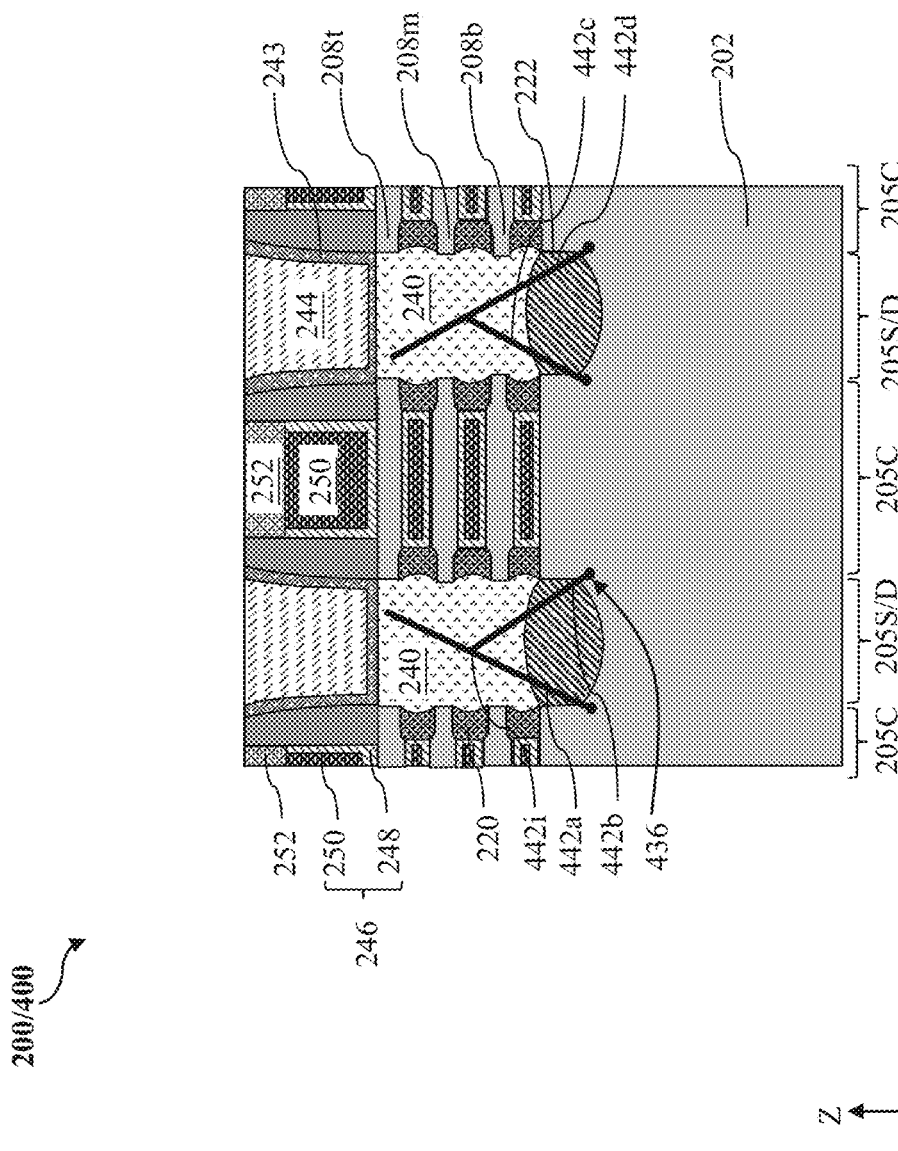

In embodiments represented in FIG. 30, the workpiece 200/400 includes a dislocation 442a intersecting a dislocation 442b, and a dislocation 442c intersecting a dislocation 442d. The dislocations 442b and 442c stop propagating at the respective intersection node 442i, and the dislocations 442a and 442d continue propagating along the (111) plane and stop at a location near the top surface of the other source/drain feature 240, respectively.

Figure 31:
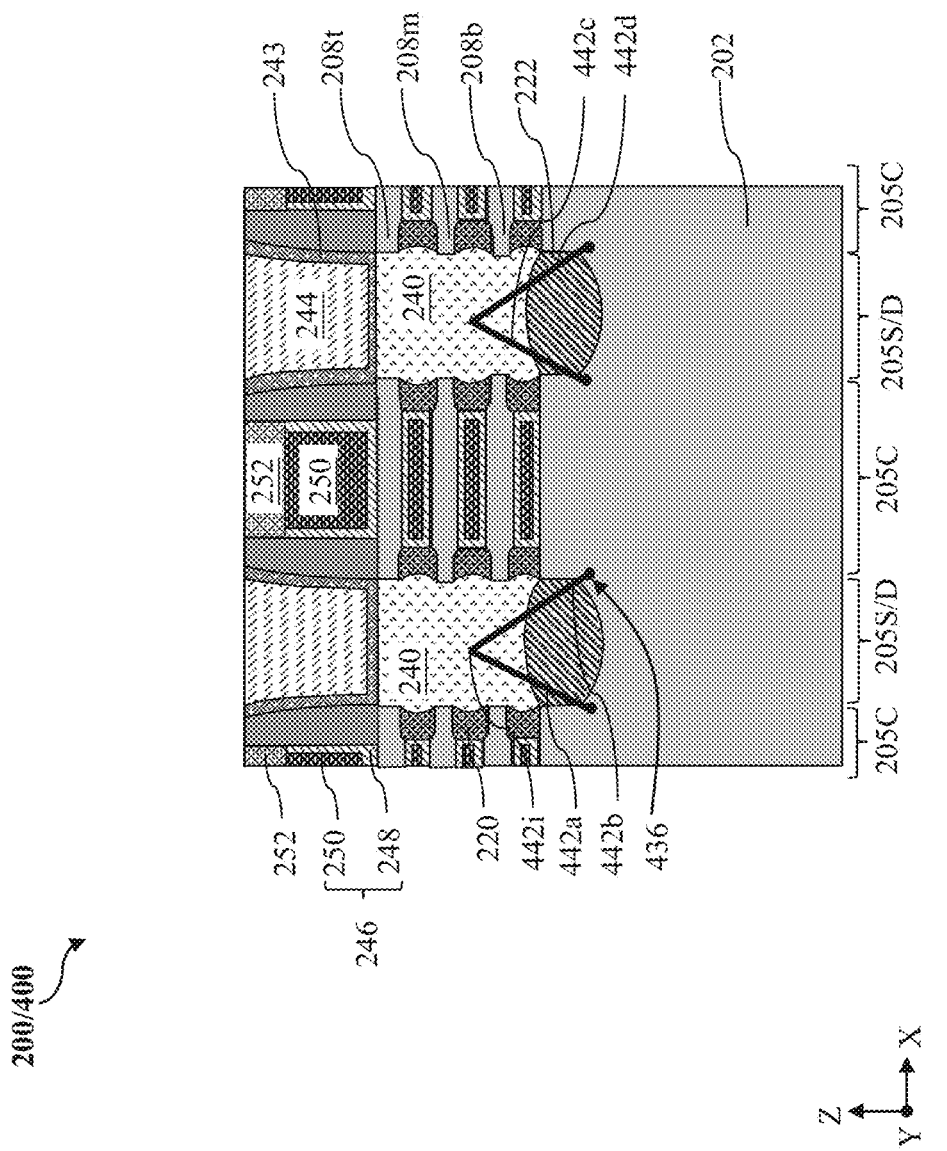

In embodiments represented in FIG. 31, the workpiece 200/400 includes two intersecting dislocations 442a and 442b and another two intersecting dislocations 442c and 442d. The dislocations 442a, 442b, 442c, and 442d stop propagating at the respective intersection node 442i. A cross-sectional view of the workpiece 200/400 includes two herringbone patterns over the source/drain regions 205S/D.

Figure 32:
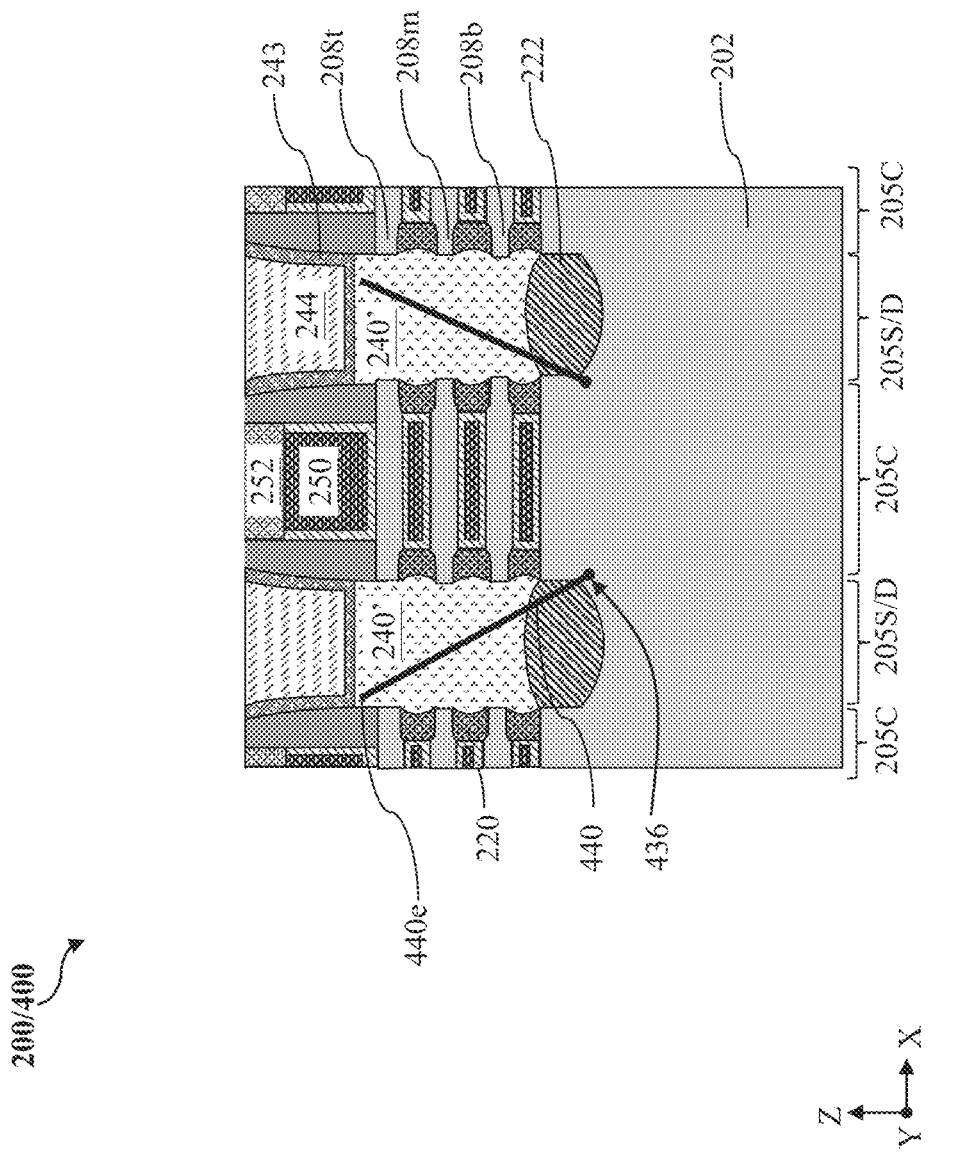

FIG. 32 depicts another alternative embodiment. As shown in FIG. 32, a top surface of the source/drain feature 240' is higher than a top surface of the topmost channel member 208t. As a result, the dislocation 440 may propagate along the (111) plane and then stop at a point 440e near a top surface of the source/drain feature 240'. The end point 440e of the dislocation 440 may be above the top surface of the topmost channel member 208t. The configuration shown in FIG. 32 may also appear in embodiments described with reference to FIGS. 26-31 such that a top surface of the source/drain features 240 is higher than a top surface of the topmost channel members 208t. By forming enlarged source/drain features 240', the parasitic resistance of the workpiece 200/400 may be reduced, the carrier mobility in the channel members may be further enhanced.

Embodiments of the present disclosure provide advantages. For example, embodiments of the present disclosure provide methods for forming GAA devices with dislocations. The dislocations are able to be formed within the active region, thereby improving the stress within the nanostructures. The increased stress in the nanostructures would thus advantageously improve carrier mobility without adding significant cost to the manufacturing process and/or device. It is understood that different embodiments may have different advantages, and that no particular advantage is necessarily required of any embodiment.

The present disclosure provides for many different embodiments. Semiconductor structures and methods of fabrication thereof are disclosed herein. In one exemplary aspect, the present disclosure is directed to a method. The method includes forming a fin-shaped structure extending from a substrate. The fin-shaped structure includes a number of channel layers interleaved by a number of sacrificial layers. The method also includes recessing a source/drain region of the fin-shaped structure to form a source/drain opening, performing a pre-amorphization implantation (PAI) process to amorphize a portion of the substrate exposed by the source/drain opening, forming a tensile stress film over the substrate, performing an annealing process to recrystallize the portion of the substrate. The recrystallized portion of the substrate includes dislocations. The method also includes forming an epitaxial source/drain feature over the source/drain opening and forming a gate structure wrapping around each of the number of channel layers.

In some embodiments, the method may also include forming an undoped epitaxial feature over the source/drain opening before the performing of the PAI process. The PAI process may also include amorphize the undoped epitaxial feature. In some embodiments, the performing of the PAI process may include implanting germanium (Ge), argon (Ar), xenon (Xe), carbon (C), or silicon (Si) into the portion of the substrate.

In some embodiments, the method may also include after the forming of the source/drain opening, performing an etching process to selectively recess the number of sacrificial layers to form a number of inner spacer recesses, and forming a number of inner spacer features in the number of inner spacer recesses, respectively.

In some embodiments, the dislocations may include a first dislocation having a dislocation core, and the dislocation core may be disposed directly under a bottommost inner spacer feature of the number of inner spacer features. In some embodiments, a vertical distance between the bottommost inner spacer feature and the dislocation core may be between about 10 nm and about 30 nm. In some embodiments, a horizontal distance between a bottommost portion of the gate structure and the dislocation core may be between about 0.5 nm and about 10 nm.

In some embodiments, the method may also include performing an etching process to selectively remove the tensile stress film before the forming of the epitaxial source/drain feature. In some embodiments, the tensile stress film may include silicon nitride (SiN), silicon carbonitride (SiCN), silicon oxynitride (SiON), or silicon oxycarbonitride (SiOCN).

In another exemplary aspect, the present disclosure is directed to a method. The method includes receiving a workpiece including a substrate and a stack over the substrate. The stack includes a number of channel layers interleaved a number of sacrificial layers. The method also includes patterning the stack and the substrate to form a fin-shaped structure, forming a dummy gate stack directly over a channel region of the fin-shaped structure, performing a pre-amorphization implantation (PAI) process to amorphize a source/drain region of the fin-shaped structure after the forming of the dummy gate stack, forming a stress film over the workpiece, performing an annealing process to recrystallize the amorphized source/drain region, the recrystallized source/drain region includes a first dislocation including a dislocation core, recessing the recrystallized source/drain region to form a source/drain trench, the dislocation core not being removed by the recessing, epitaxially forming a source/drain feature in the source/drain trench, and replacing the dummy gate stack with a gate structure.

In some embodiments, the performing of the PAI process may include performing a first PAI process including a first ion beam, wherein the first ion beam is substantially perpendicular to the substrate and performing a second PAI process including a second ion beam, wherein an angle between the second ion beam and the first ion beam may be between about 0° and about 10°.

In some embodiments, the method may also include after the recessing, selectively and partially etching the number of sacrificial layers to form inner spacer recesses, forming inner spacer features in the inner spacer recesses, and selectively removing the number of sacrificial layers. In some embodiments, the epitaxial source/drain feature may include silicon, phosphorus-doped silicon (Si:P), carbon-doped silicon (Si:C), or carbon phosphorus-doped silicon. In some embodiments, the PAI process may be implemented at a temperature ranging between about −100° C. and about −60° C. In some embodiments, the annealing process may include a two-step rapid thermal annealing (RTA) process.

In yet another exemplary aspect, the present disclosure is directed to a semiconductor device. The semiconductor device includes a number of nanostructures interleaved by number of inner spacer features, an N-type source/drain feature coupled to each of the number of nanostructures, and a gate structure wrapping around each of the number of nanostructures. A carrier mobility in a bottommost nanostructure of the number of nanostructures is greater than a carrier mobility in a topmost nanostructure of the number of nanostructures.

In some embodiments, the semiconductor device may also include a source/drain feature coupled to the number of nanostructures, and a first dislocation propagating from a dislocation core to the source/drain feature. The dislocation core may be disposed below the number of nanostructures.

In some embodiments, the semiconductor device may also include a second dislocation extending from a second dislocation core to the source/drain feature. The first dislocation may extend along a first crystal plane, the second dislocation may extend along a second crystal plane, the first dislocation may intersect the second dislocation at an intersection location in the source/drain feature, and the first dislocation may propagate along the first crystal plane after the intersection location, and the second dislocation terminates at the intersection location.

In some embodiments, a vertical distance between the bottommost inner spacer feature and the first dislocation core may be between about 10 nm and about 30 nm. In some embodiments, a horizontal distance between a bottommost portion of the gate structure and the first dislocation core may be between about 0.5 nm and about 10 nm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece including:
        a fin-shaped structure comprising a plurality of channel layers interleaved by a plurality of sacrificial layers over a substrate;
    forming a dummy gate stack directly over a channel region of the fin-shaped structure;
    forming a gate spacer extending along a sidewall surface of the dummy gate stack
    after the forming of the dummy gate stack, performing a pre-amorphization implantation (PAI) process to amorphize a source/drain region of the fin-shaped structure, wherein the amorphized source/drain region spans a first width;
    forming a stress film over the workpiece;
    performing an annealing process to recrystallize the amorphized source/drain region, the recrystallized source/drain region comprising a first dislocation having a first portion disposed directly under the gate spacer and a second portion extending from the first portion;
    recessing the recrystallized source/drain region to form a source/drain trench, wherein the recessing of the recrystallized source/drain region at least partially removes the second portion of the first dislocation, wherein, upon formation of the source/drain trench, a dislocation core of the first dislocation is disposed laterally adjacent to the source/drain trench and above a bottom surface of the source/drain trench, and wherein the source/drain trench spans a second width less than the first width;

forming an inner spacer feature disposed between the substrate and a bottommost channel layer of the plurality of channel layers, wherein a distance between the inner spacer feature and the dislocation core of the first dislocation is between about 10 mm and about 30 mm;

epitaxially forming a source/drain feature in the source/drain trench; and replacing the dummy gate stack with a gate structure.

2. The method of claim 1, wherein the performing of the PAI process comprises:
    performing a first PAI process including a first ion beam, wherein the first ion beam is substantially perpendicular to the substrate; and
    performing a second PAI process including a second ion beam, wherein an angle between the second ion beam and the first ion beam is between about 0° and about 10°.

3. The method of claim 1, further comprising:
    selectively removing the plurality of sacrificial layers.

4. The method of claim 1, wherein the epitaxial source/drain feature comprises silicon, phosphorus-doped silicon (Si:P), carbon-doped silicon (Si:C), or carbon phosphorus-doped silicon.

5. The method of claim 1, wherein the PAI process is implemented at a temperature ranging between about −100°90 C. and about −60° C.

6. The method of claim 1, wherein the annealing process comprises a two-step rapid thermal annealing (RTA) process.

7. A method, comprising:
    forming an active region comprising a plurality of channel layers interleaved by a plurality of sacrificial layers over a substrate;
    forming a dummy gate stack over the substrate;
    forming a gate spacers extending along sidewalls of the dummy gate stack and in direct contact with a topmost channel layer of the plurality of channel layers;
    performing a pre-amorphization implantation (PAI) process to convert a portion of the active region into an amorphous region, wherein a bottom surface of the amorphous region is below a bottommost surface of the plurality of channel layers;
    forming a tensile stress film over the substrate;
    performing an annealing process to recrystallize the amorphous region, the recrystallized region of the substrate comprising dislocations;
    selectively removing the tensile stress film;
    after the selectively removing of the tensile stress film, removing portions of the recrystallized region to form source/drain openings, a dislocation core of one of the dislocations, wherein, upon formation of the source/drain openings, a dislocation core of one of the dislocations is disposed laterally adjacent to one of the source/drain openings and above a bottom surface of the one of the source/drain openings;
    forming source/drain features in the source/drain openings; and
    replacing the dummy gate stack and the plurality of sacrificial layers with a gate structure, wherein a bottommost portion of the gate structure is disposed under a bottommost channel layer of the plurality of channel layers.

8. The method of claim 7, wherein, a portion of the amorphous region is disposed directly under the gate spacers.

9. The method of claim 7, wherein the source/drain features comprise an undoped epitaxial feature in a lower portion of the source/drain openings.

10. The method of claim 7, wherein the performing of the PAI process comprises implanting germanium (Ge), argon (Ar), xenon (Xe), carbon (C), or silicon (Si) into the portion of the substrate.

11. The method of claim 7, wherein the dislocation core is below the active region.

12. The method of claim 7, wherein a horizontal distance between a bottommost portion of the gate structure and the dislocation core is between about 0.5 mm and about 10 mm.

13. The method of claim 11, further comprising:
    after the forming of the source/drain openings, performing an etching process to selectively recess the plurality of sacrificial layers to form a plurality of inner spacer recesses; and
    forming a plurality of inner spacer features in the plurality of inner spacer recesses, respectively.

14. The method of claim 13, wherein a vertical distance between a bottommost inner spacer feature of the plurality of inner spacer features and the dislocation core is between about 10 mm and about 30 mm.

15. The method of claim 7, wherein the tensile stress film comprises silicon nitride (SiN), silicon carbonitride (SiCN), silicon oxynitride (SiON), or silicon oxycarbonitride (SiOCN).

16. A method, comprising:
    forming a fin-shaped active region over a substrate;
    forming a dummy gate stack intersecting the fin-shaped active region;
    forming a gate spacer adjacent to the dummy gate stack;
    performing an implantation process to amorphize a portion of the fin-shaped active region not covered by the dummy gate stack into an amorphous region;
    performing an annealing process to recrystallize the amorphized portion, the recrystallized portion of the substrate comprising dislocations, wherein one of the dislocations has a dislocation core;
    after the performing of the annealing process, recessing the recrystallized portion to form a source/drain opening, wherein a portion of the dislocations is disposed laterally adjacent to the source/drain opening, wherein a bottom surface of the source/drain opening is below the dislocation core;
    after the recessing of the recrystallized portion, forming a source/drain feature in the source/drain opening, wherein a bottom surface of the source/drain feature is below the dislocation core;
    selectively removing the dummy gate stack; and
    forming a gate structure adjacent to the source/drain feature.

17. The method of claim 16, wherein the fin-shaped active region comprises a vertical stack of alternating channel layers and sacrificial layers, and the method further comprises:
    selectively removing the sacrificial layers to form gate openings, wherein the gate structure is also formed in the gate openings.

18. The method of claim 16, further comprising:
    forming inner spacer features to isolate the gate structure from the source/drain feature.

19. The method of claim 18, wherein a portion of the dislocations is disposed directly under the inner spacer features.

20. The method of claim 16, wherein the forming of the source/drain feature comprises:
- epitaxially growing an undoped semiconductor layer in the source/drain opening; and
- epitaxially growing a doped semiconductor layer in the source/drain opening and over the undoped semiconductor layer.

* * * * *